(12) United States Patent
Vlasov

(10) Patent No.: US 11,393,616 B2
(45) Date of Patent: Jul. 19, 2022

(54) ELECTROMAGNETIC PULSE DRIVER

(71) Applicant: Logitech Europe S.A., Lausanne (CH)

(72) Inventor: Maxim Vlasov, Geneva (CH)

(73) Assignee: Logitech Europe S.A., Lausanne (CH)

(*) Notice: Subject to any disclaimer, the term of this patent is extended or adjusted under 35 U.S.C. 154(b) by 119 days.

(21) Appl. No.: 17/031,258

(22) Filed: Sep. 24, 2020

(65) Prior Publication Data

US 2022/0093303 A1 Mar. 24, 2022

(51) Int. Cl.
| | |
|---|---|
| *H01H 47/00* | (2006.01) |
| *H01F 7/06* | (2006.01) |
| *H01F 7/08* | (2006.01) |
| *H02J 7/00* | (2006.01) |
| *H03K 3/037* | (2006.01) |
| *H03K 5/24* | (2006.01) |

(52) U.S. Cl.
CPC ............ *H01F 7/064* (2013.01); *H01F 7/081* (2013.01); *H02J 7/0063* (2013.01); *H03K 3/037* (2013.01); *H03K 5/24* (2013.01)

(58) Field of Classification Search
None
See application file for complete search history.

(56) References Cited

U.S. PATENT DOCUMENTS 3,774,050 A * 11/1973 Littwin .................. H01F 7/064
361/194
4,215,297 A * 7/1980 Jacquemet .......... B25D 11/064
318/132

* cited by examiner

*Primary Examiner* — Stephen W Jackson
(74) *Attorney, Agent, or Firm* — Kilpatrick Townsend & Stockton, LLP

(57) ABSTRACT

A driver circuit is provided to connect a charged capacitor through a switch to the inductive windings of an electromagnet for a haptic feedback application. A feedback circuit provides an indication of the current supplied. When the current reaches a desired level, the current is cut off, rather than being controlled. The cutoff level can be slightly below the desired level to allow the desired level to be reached with overshoot. A diode is provided in parallel with the electromagnet winding when the current is shut off, providing a recirculation path that prevents the current from being discharged, thereby dissipating less energy than classical solutions.

20 Claims, 24 Drawing Sheets

ELECTROMAGNETIC PULSE DRIVER

BACKGROUND

Unless otherwise indicated herein, the materials described in this section are not prior art to the claims in this application and are not admitted to be prior art by inclusion in this section.

The present invention relates to drivers for electromagnetic (EM) and electro-permanent magnets (EPM) for driving actuators, such as for haptic devices. Examples include EPM based magnetic ratchet (e.g., for mouse scroll wheel), EPM based reluctance motor, EPM controlled bi-stable mechanical latch systems and EPM controlled ferromagnetic. All these devices are controlled by the magnitude of the instant electric current flowing through the coil winding.

EM and EPM drivers may be used, for example, in physical computer peripheral interface devices such as keyboards, mice, joysticks, wheels, etc., that can be physical devices that a user manipulates to interface with a computer device. Physical computer peripheral interface devices can include wheel input elements that a user can manipulate. For example, computer mice can include scroll wheels that can be used to pan a viewing window across an image or document displayed by a computer device in response to rotating the scroll wheel around an axis. Interface wheels can operate across a plurality of friction profiles. For example, a mouse scroll wheel may operate selectively between a free-wheeling mode and a ratcheting mode. The ratchet can be provided using electromagnets, such as electro-permanent magnets. By turning the magnetic field on and off, interactions with magnetic ridges in a scrolling wheel can change from a resistive force to no resistive force rapidly, giving a physical ratchet feel to turning the wheel. Similar effects can be provided for other haptic devices, such as Braille readers or simply vibration feedback inducing haptic devices.

A pulse driver provides the current to the winding of the electromagnet. The pulse driver is often in battery powered devices. The peak battery current can be a few amperes, whereas the peak discharge current required by the haptic actuator can be dozens of amperes. Therefore a power converter and actuation energy reservoir are often used to provide the needed bursts of current. The energy reservoir can be a capacitor which can be charged sufficiently to deliver many dozens of amperes. The capacitor forms a tank circuit with the inductor of the electromagnet windings when switched to connect the capacitor to the inductor.

The classical approach dissipates a lot of energy and Electro-Magnetic Interference (EMI).

BRIEF SUMMARY

In some embodiments, a driver circuit is provided to connect a charged capacitor through a switch to the inductive windings of an electromagnet for a haptic feedback or other application. A feedback circuit provides an indication of the current supplied. When the current reaches a desired level, the current is cut off, rather than being controlled. This takes advantage of the insight that for a haptic feedback application, and similar applications, the value of the current, and thus the electromagnetic force, is felt at the peak, and need not be controlled beyond the peak. By cutting off the current, this avoids further discharging of the capacitor, maintaining 80% or more of its charge for the next pulse in certain embodiments. The cutoff level can be slightly below the desired peak level to allow the desired peak level to be reached with overshoot.

In some embodiments, a diode is provided in parallel with an electro-permanent magnets (EPM) winding when the current is shut off, providing a recirculation path that prevents the voltage transient across the EPM terminals and ensures the gradual current decay though the EPM or the actuator winding. This causes a force decay where the EPM is part of a solenoid, linear motors or similar electro-motive device. The current cut-off is a pulse method that consumes less power than the classic continuous (linear or PWM) systems overall due to the almost instantaneous shut down once the target current though the coil winding is reached.

In certain embodiments, the switching circuit is designed to allow fast switching, which allows better control over the amount of overshoot. The amount of overshoot can be predicted because the magnetizing force of the electromagnet flattens the sinusoidal charging curve to linear in the region before the desired peak current. Thus, with a fast switching circuit, the overshoot can be fairly accurately predicted. In particular, the fast switching circuit is obtained with an H-bridge transistor switch. The transistors in the H-bridge are a smaller size (such as 10 times smaller) than required to deliver a constant current at the desired current level. This takes advantage of the fact that such transistors can handle a much higher current pulse than the rated constant current capacity. A smaller transistor has a smaller gate, with smaller gate capacitance, and thus a faster switching speed. A voltage to current conversion via controlled impedance is used for the feedback path, allowing the use of a comparator to simplify the control circuit.

In further embodiments, a fast digital controller design for the feedback control is used to further provide the fast switching speed needed to limit the overshoot. A flip-flop that works like a triac is connected to the comparator output to provide the fast switching. The flip-flop transistors, for fast switching, are configured as at least one Silicon Controlled Rectifier or at least two transistors configured as an SCR or a Flip-Flop.

In certain embodiments, a circuit is provided with a battery, a multiple-ampere charging capacitor, and a charging circuit connected between the battery and the capacitor. An actuator is driven by an electromagnetic coil. A switching circuit is connected between the multiple-ampere capacitor and the electromagnetic coil. The switching circuit includes an H-bridge of four transistors. A diode is configured in parallel with the electromagnetic coil, across one of the four transistors, to handle the parasitic capacitance and provide a current recirculation path when the charging capacitor is disconnected from the electromagnetic coil. A sensing resistor is connected to the electromagnetic coil. A comparator has a first input connected to the sensing resistor and a second input connected to a reference voltage. A digital controller is connected to an output of the comparator. The digital controller is a D flip-flop, and is programmed to provide a signal on an output of the digital controller connected to the switching circuit to disconnect the charging capacitor from the electromagnetic coil when a current from the charging capacitor to the electromagnetic coil creates a voltage across the sensing resistor that reaches the reference voltage.

In another embodiment, a method of charging an electromagnetic actuator is shown. First, a multiple-ampere capacitor is charged with a battery. The capacitor is switched from being connected to the battery for charging to being connected to the electromagnetic actuator for providing a current pulse to activate the electromagnetic actuator. The amount of current applied to the electromagnetic actuator is detected. The capacitor is disconnected from the electromagnetic actuator when the amount of current is detected to be at a threshold level below a desired current peak. The multiple-ampere capacitor can then be recharged with the battery for the next cycle or pulse, being only partially discharged due to the disconnecting of the capacitor at the threshold level.

This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

Aspects and features of the various embodiments will be more apparent by describing examples with reference to the accompanying drawings, in which.

DETAILED DESCRIPTION

Figure 1:
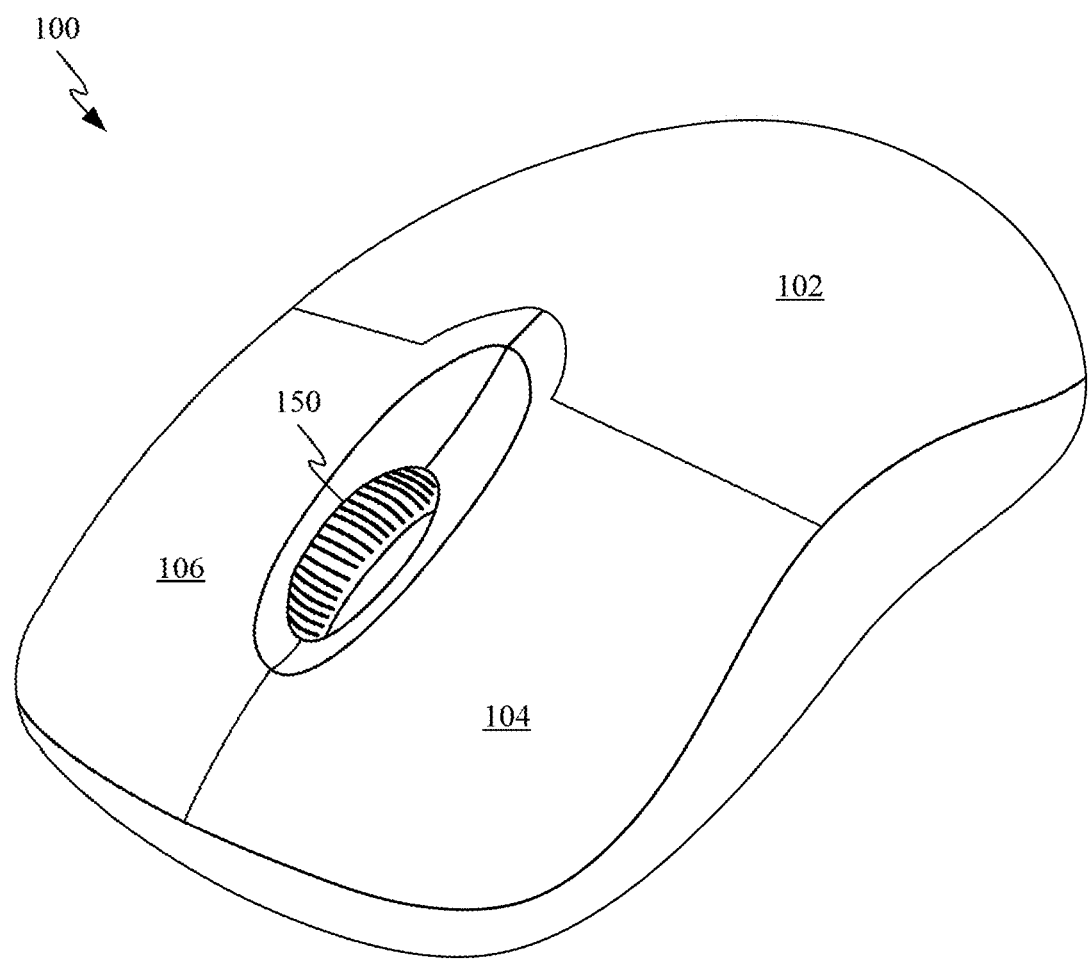
FIG. 1 shows an exemplary user input device suitable for use with the described embodiments and taking the form of a wireless mouse.

While certain embodiments are described, these embodiments are presented by way of example only, and are not intended to limit the scope of protection. The apparatuses and systems described herein may be embodied in a variety of other forms. Furthermore, various omissions, substitutions, and changes in the form of the example methods and systems described herein may be made without departing from the scope of protection.

In some embodiments, a driver circuit is provided to connect a charged capacitor through a switch to the inductive windings of an electromagnet for a haptic feedback or other EM actuator application. A feedback circuit provides an indication of the current supplied. When the current reaches a desired level, classical control systems constantly monitor the current and continuously control it. Embodiments of the present invention simply cut off the current, rather than controlling it.

The classical linear control systems continuously monitor the error between the reference point and the output current setting. Indeed under normal conditions, the aforementioned error will be minimized by the system either monotonically (no decaying oscillations induced and no overshoot) or non-monotonically with the decaying oscillations. Due to the nature of the continuous control system and ever varying parameters of the system the number of undesired oscillation cycles (normally decaying, since the function will converge to the steady state) isn't well controlled. I.e., there would be multiple oscillation cycles before the system will converge to the steady state. The more reactive the system is (larger bandwidth), the higher overshoot can be observed.

Embodiments of the present invention have no oscillations possible under any circumstances by the design. This is because once armed before each cycle, the flip-flop goes from ACTIVE to CUT-OFF state only once per discharge cycle. In contrast, for the classical linear regulator with the feedback loop the step response function could have multiple decaying oscillations and a large overshoot. The overshoot occurs due to the propagation delay in the error amplifier. In other words, a classical linear control system with a randomly aging actuator could have a tendency to oscillate whereas embodiments of the current invention won't. Also unwanted oscillation will lead to the EMI emissions and not precise EPM or transducer operation.

The embodiments of the present invention take advantage of the insight that for a haptic feedback application, and similar applications, the value of the current, and thus the electromagnetic force, is felt at the peak, and need not be controlled beyond the peak. By cutting off the current, this avoids further discharging of the capacitor, maintaining 80-90% of its charge for the next pulse in certain embodiments. The cutoff level can be slightly below the desired level to allow the desired level to be reached with overshoot. A diode is provided in parallel with the electromagnet winding when the current is shut off, providing a recirculation path that prevents the current from being discharged, thereby dissipating less energy than classical solutions. In one example embodiment, the electromagnetic force is applied to a scrolling wheel on a mouse, keyboard, or other computer peripheral. The below discussion sets forth one such scrolling wheel application in some detail, then describes the details of the novel drive circuitry.

Scrolling Wheel Detail

A peripheral input device used as an interface between a user and a computer device can include a rotary input control as a physical element. The user may rotate the input control to cause a corresponding command to be sent to the computer device. An example of such an input control is a scroll wheel that can be located between the left and right buttons on top of a peripheral input device. Scroll wheels can be used to pan a field of view of a computer display. For example, a scroll wheel can be used by a user to scroll through a view of a document displayed on a computer screen. Other possible controls are compatible with the described embodiments that can include, e.g., a rotary dial or rotary encoder. However, for the purpose of simplicity examples of a scroll wheel will be used, but this should not limit the contemplated scope of the described embodiments.

A scroll wheel may have different modes of operation. For example, one mode of operation can be a free-wheeling mode wherein the scroll wheel can be rotated around an axis with a relatively constant and low coefficient of friction (which can be referred to as a first friction profile). Using such a mode, a user can swiftly pan their view over a document with a single finger movement to rotate the wheel. Another mode can be a ratcheted mode wherein the scroll wheel encounters periodic segments of relatively high friction with lower friction segments between (which can be referred to as a friction profile different from the first friction profile). Such a mode can allow a user to have greater control when panning through a document as a single finger movement to rotate the wheel may result in a metered panning of a view.

Some peripheral input devices allow a user to selectively enable a different friction profile for application to a scroll wheel to change the behavior of the scroll wheel according to a corresponding computer application, intended use, or user preference, for example. Different mechanisms are disclosed that can be used to change the friction profile applied to a wheel of a peripheral input device. Each of the mechanisms provide different power usage, noise, user feel, and actuation time characteristics. In some embodiments, the friction profile can be changed in accordance with parameters provided by an active application. For example, the friction profile could increase sharply to signify a brief pause/stop to scrolling to emphasize a particular feature. Additional force applied to overcome the increased friction profile can allow scrolling to continue and could in certain instances initiate a change back to the initial friction profile.

These and other embodiments are discussed below with reference to FIGS. 2-9 however, those skilled in the art will readily appreciate that the detailed description given herein with respect to these figures is for explanatory purposes only and should not be construed as limiting.

FIG. 1 shows an exemplary user input device 100 suitable for use with the described embodiments and taking the form of a wireless mouse. Wireless mouse 100 includes a housing 102 and input buttons 102 and 104. Positioned between input buttons 102 and 104 is a rotary input control 150 taking the form of a scrolling wheel (also referred to as a "wheel"). Rotary input control 150 can include a mechanism that can be used to implement a ratcheting friction profile for rotation of rotary input control 150. The mechanism can include an electro permanent magnetic ("EPM") actuator for changing a friction profile associated with rotation of rotary input control 150 as further described in the embodiments that follow.

Figure 2A:
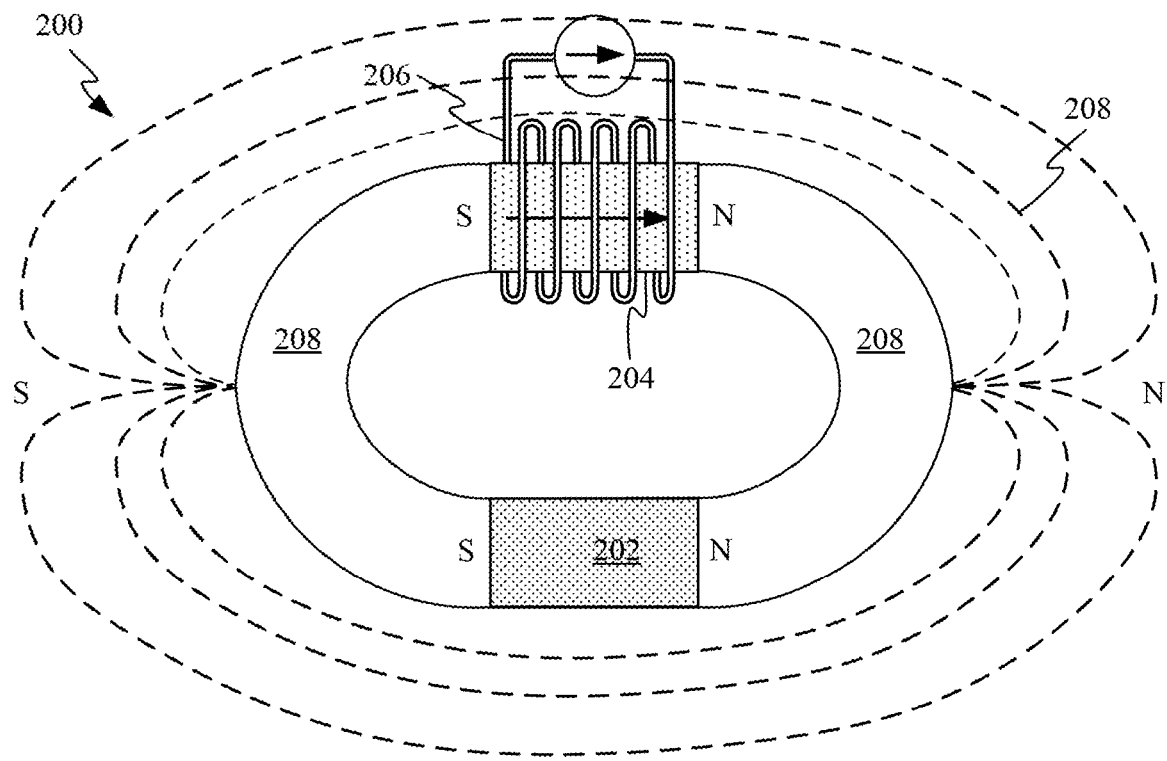
FIG. 2A shows an exemplary electro permanent magnet with dashed lines depicting a magnetic flux emitted by electro permanent magnet that show how with both first and second permanent magnets oriented in the same direction, magnetic flux is released from the electro permanent magnet to create well defined north and south poles, according to certain embodiments.
Figure 2B:
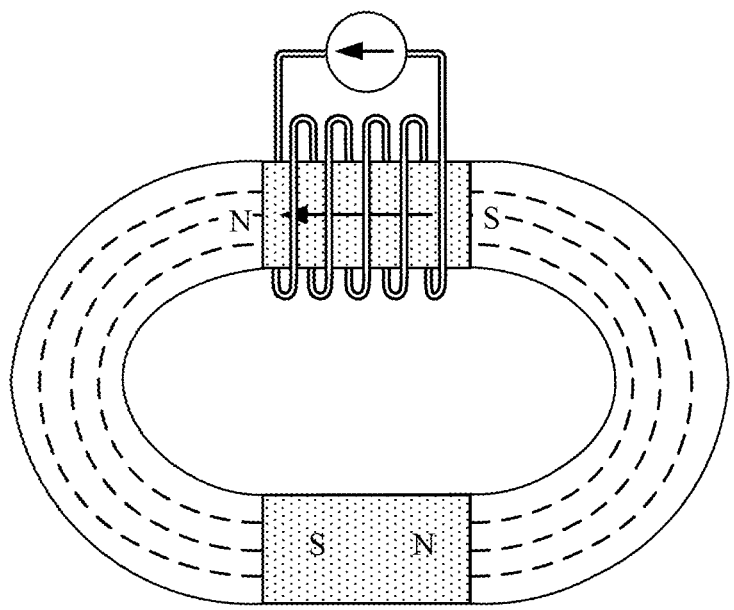
FIG. 2B shows how when the polarity of first permanent magnet is opposite the polarity of second permanent magnet, the magnetic flux generated by both permanent magnets remains substantially contained within and circulating through ferromagnetic poles, the first permanent magnet and the second permanent magnet, according to certain embodiments.

FIGS. 2A-2B show an exemplary electro permanent magnet 200. In particular, electro permanent magnet 200 includes a first permanent magnet 202 and a second permanent magnet 204. First permanent magnet 202 can have a higher intrinsic coercivity than second permanent magnet 204. In some embodiments, permanent magnet 202 can take the form of a rare earth (e.g., Neodymium Iron Boron or Samarium Cobalt) magnet and second permanent magnet 204 can take the form of a Ferromagnetic (e.g., Alnico or ferrite) magnet. The lower intrinsic coercivity of second permanent magnet 204 allows for a magnetizing coil 206 to emit a magnetic field of sufficient strength to reverse a polarity of the magnetic field emitted by second permanent magnet 204 without affecting the magnetization of first permanent magnet 202. For example, in some embodiments, an intrinsic coercivity of first permanent magnet 202 can be over ten times greater than an intrinsic coercivity of second permanent magnet 204. The lower intrinsic coercivity of second permanent magnet 204 also reduces the amount of electrical energy expended to flip the polarity of second permanent magnet 204, thereby allowing for more efficient operation of electro permanent magnet 200. First permanent magnet 202 and second permanent magnet 204 are each positioned between and in direct contact or at least close contact with ferromagnetic poles 208. Ferromagnetic poles 208 can be formed from a ferritic material such as mild steel, having an even lower intrinsic coercivity than second permanent magnet 204. Ferromagnetic poles 208 helps guide the magnetic fields emitted by first permanent magnet 202 and second permanent magnet 204. In some embodiments a size and shape of ferromagnetic poles 208 can be adjusted to produce a magnetic field having a desired size and shape.

FIG. 2A shows dashed lines 208 depicting a magnetic flux emitted by electro permanent magnet 200 that show how with both first and second permanent magnets 202 and 204 oriented in the same direction, magnetic flux is released from electro permanent magnet 200 to create well defined north and south poles. This magnetic field is symmetrical, as depicted, when the strengths of the magnetic fields emitted by the two permanent magnets are about the same.

FIG. 2B shows how when the polarity of first permanent magnet 202 is opposite the polarity of second permanent magnet 204, the magnetic flux generated by both permanent magnets remains substantially contained within and circulating through ferromagnetic poles 208, first permanent magnet 202 and second permanent magnet 204. This results in electro permanent magnet 200 emitting little to no magnetic field. These principles can be applied to the embodiments that follow in FIGS. 3A-7.

Figure 3A:
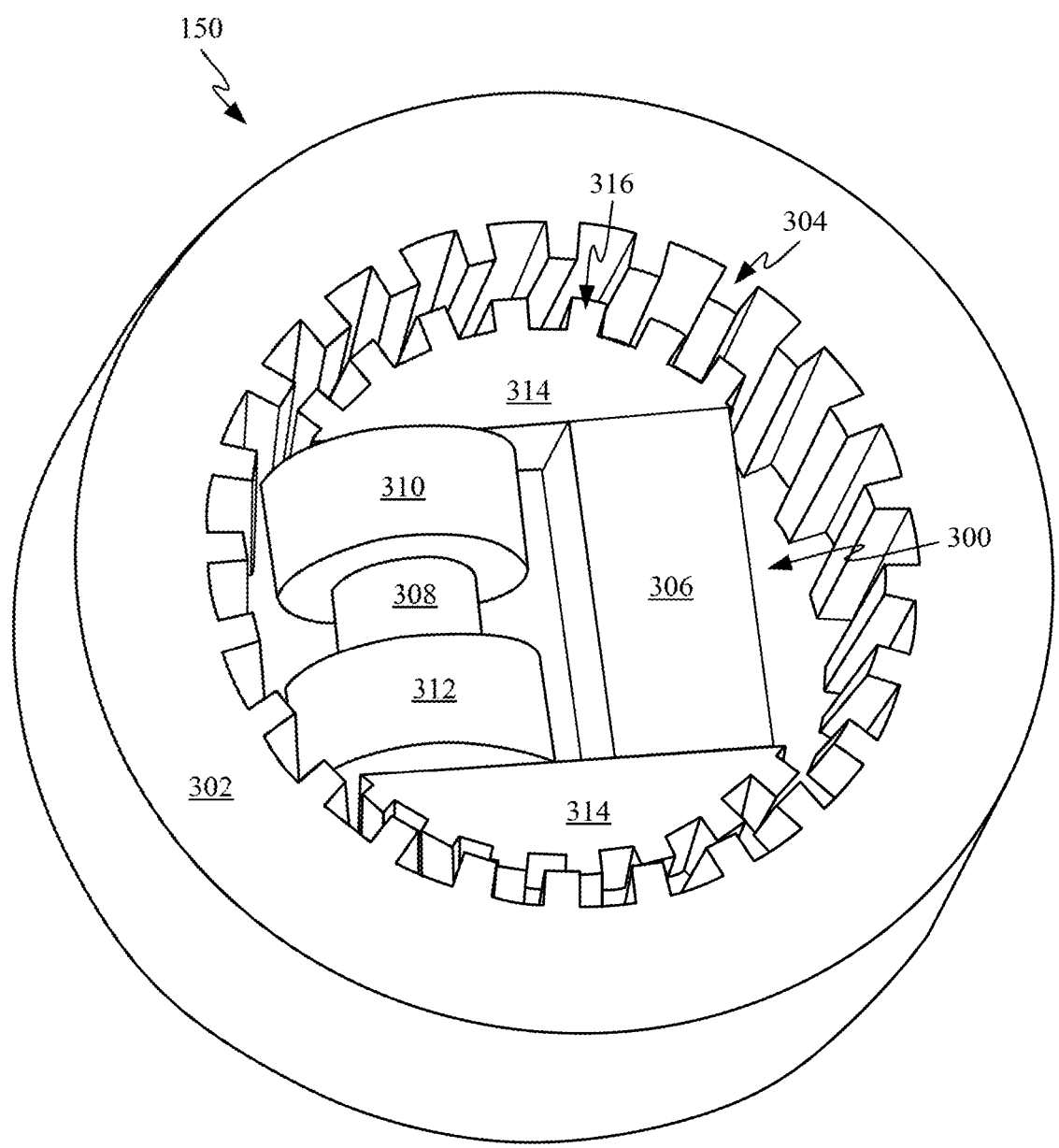
FIG. 3A shows a perspective view of an exemplary implementation in which an electro permanent magnet is configured to alter a resistance profile of a rotary input control compatible with the device depicted in FIG. 1, according to certain embodiments.

FIG. 3A shows a perspective view of an exemplary implementation in which an electro permanent magnet is configured to alter a resistance profile of a rotary input control 150 compatible with the device depicted in FIG. 1. The electro permanent magnet 300 is disposed within a central opening defined by ferromagnetic wheel 302. Ferromagnetic wheel 302 includes multiple teeth 304 protruding into the central opening and toward electro permanent magnet 300. Electro permanent magnet 300 includes a first permanent magnet 306 and a second permanent magnet 308. Magnetizing coils 310 and 312 are configured to reverse a polarity of the magnetic field emitted by second permanent magnet 308 in order to change a resistance profile of rotary input control 150. Ferromagnetic poles 314 each includes radially protruding teeth 316 that are spaced at the same interval as teeth 304 of ferromagnetic wheel 302. Radially protruding teeth 316 concentrate the magnetic field emitted by electro permanent magnet 300 so that rotation of ferromagnetic wheel 302 generates a resistance profile that provides a user with a varying amount of resistance, where the variation in resistance occurs at a rate that corresponds to a speed at which ferromagnetic wheel 302 is rotating. The variation in resistance is caused by interaction between the magnetic field emitted by electro permanent magnet 300 and ferromagnetic materials within the teeth of ferromagnetic wheel 302. Note that reference is made throughout this disclosure to "poles," which can include the two ends of a magnet, or at the ends of a magnetically conductive structure coupled to the end of a magnet pole, which effectively places the magnetic poles at the end magnetically conductive structure. For example, in FIG. 4A there are ferromagnetic poles 314, which are magnetically conductive members coupled to the magnets themselves. In operation, magnetic lines of flux emanate from said magnetically conductive members rather than from the end of the magnets (as they conduct the magnetic field) and magnetically interact with teeth 304 of wheel 302, as further described below and as would be appreciated by one of ordinary skill in the art with the benefit of this disclosure.

Figure 3B:
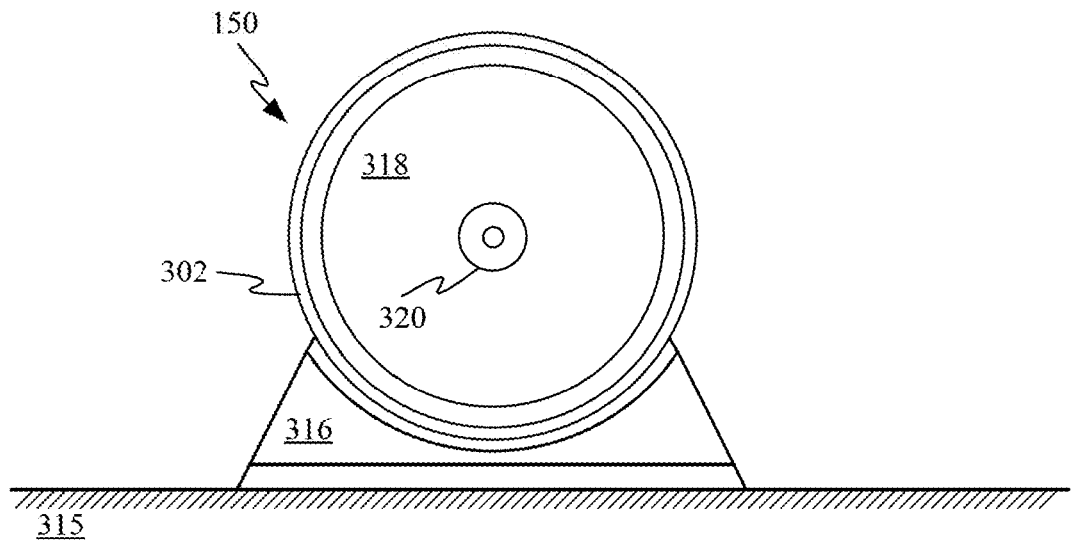
FIG. 3B shows a side view of rotary input control elevated above a support surface by a support structure, according to certain embodiments.
Figure 3C:
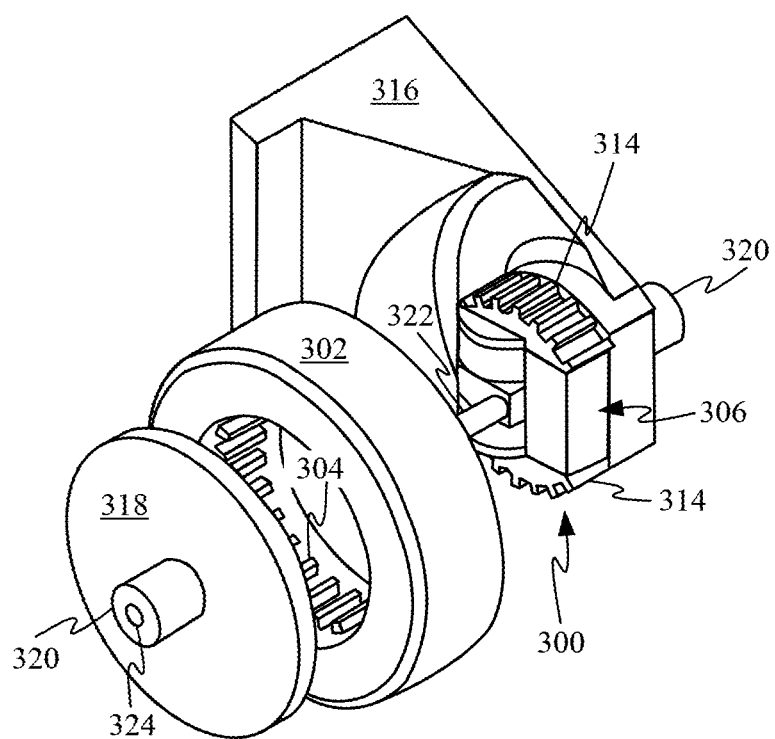
FIG. 3C shows an exploded view of rotary input control and support structure, according to certain embodiments.

FIGS. 3B-3C show a support structure for rotary input control 150. FIG. 3B shows a side view of rotary input control 150 elevated above a support surface 315 by a support structure 316. The central opening of ferromagnetic wheel 302 is covered by a non-magnetic bearing assembly 318 that includes a self-lubricated axle 320 that can be configured to stabilize ferromagnetic wheel 302 during use by engaging a bearing of housing 102 (not depicted). In some embodiments, support surface 315 can take the form of a wall of an input device housing, such as housing 102 as depicted in FIG. 1. In some embodiments, support structure 316 can integrated or incorporated into the wall of the input device housing.

FIG. 3C shows an exploded view of rotary input control 150 and support structure 316. In particular, teeth 304 do not extend axially through the central opening defined by ferromagnetic wheel 302 but instead leave space for a portion of bearing assembly 318 to engage ferromagnetic wheel 302 by an interference fit. The interference fit provides a simple way for bearing assembly 318 to be axially aligned with ferromagnetic wheel 302. Alternatively, ferromagnetic wheel 302 could also be adhesively coupled to one side of ferromagnetic wheel 302. FIG. 3C also shows how electro permanent magnet 300 can be coupled to support structure 316 as well as how a shaft 322 extends through a central region of electro permanent magnet 300. In particular, shaft 322 can extend between first permanent magnet 306 and second permanent magnet 308. Shaft 322 engages an opening defined by self-lubricated axle 320 to couple ferromagnetic wheel 302 to support structure 316. It should be noted that in some embodiments, bearing assembly 318 and support structure 316 can both be constructed of polymer material to avoid any unwanted interference with electro permanent magnet 300.

Figure 4A:
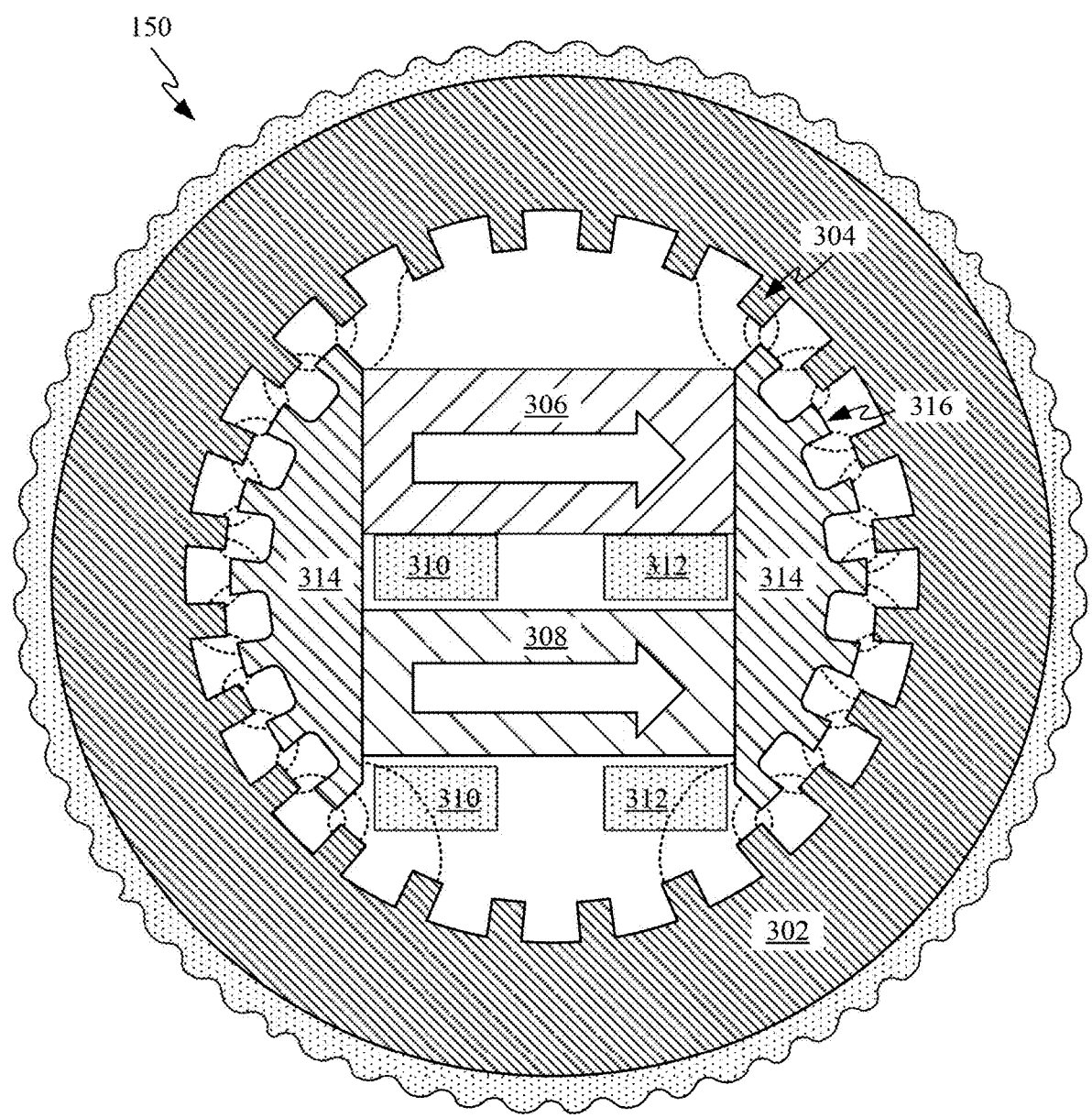
FIG. 4A shows a cross-sectional view of a rotary input control in which a polarity of the magnetic fields emitted by permanent magnets are oriented in the same direction and how a magnetic flux emitted from radially protruding teeth from the EPM assembly interacts with the ferromagnetic material making up teeth on the wheel when they are offset (not aligned), according to certain embodiments.
Figure 4B:
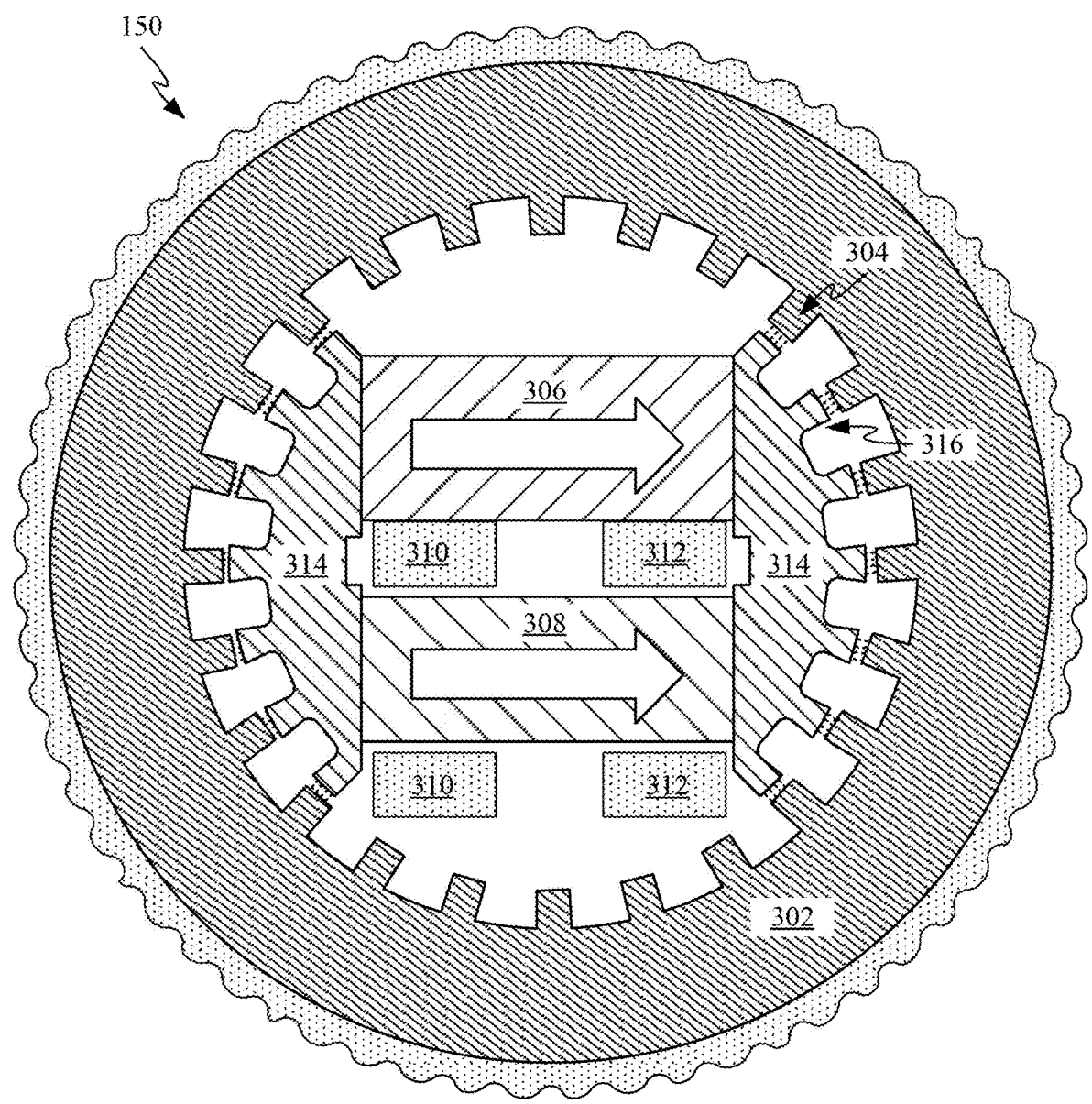
FIG. 4B shows a cross-sectional view of a rotary input control in which a polarity of the magnetic fields emitted by permanent magnets are oriented in the same direction when the radially protruding teeth are aligned with a respective one of the teeth on the wheel, according to certain embodiments.

FIGS. 4A-4B show cross sectional views of rotary input control 150 in which a polarity of the magnetic fields emitted by permanent magnets 306 and 308 are oriented in the same direction. FIG. 4A shows how a magnetic flux emitted from radially protruding teeth 316 interacts with the ferromagnetic material making up teeth 304. In the depicted position, each of teeth 304 are positioned between two adjacent radially protruding teeth 304, which results in a resistance to rotation of ferromagnetic wheel 302 in either direction being low. That is, FIG. 4A shows protruding teeth 316 configured at their farthest position with respect to teeth 304 making for a weaker magnetic coupling and consequently provides less resistance to rotation of rotary input control 150. However, when radially protruding teeth 316 are aligned with a respective one of teeth 304, as shown in FIG. 4B, rotation of ferromagnetic wheel 302 becomes more difficult due to rotation in either direction moving teeth 304 farther away from a respective one of radially protruding teeth 316. That is, FIG. 4B shows protruding teeth 316 configured at their closest position with respect to teeth 304 making for a stronger magnetic coupling and consequently provides more resistance to rotation of rotary input control 150. In this way, a resistance profile can provide a ratcheting feedback to a user without the need for any movement of electro permanent magnet 300. In some embodiments, ferromagnetic wheel can include a tactile ribbed layer that improves a grip of a user's finger on rotary input control 150.

Figure 4C:
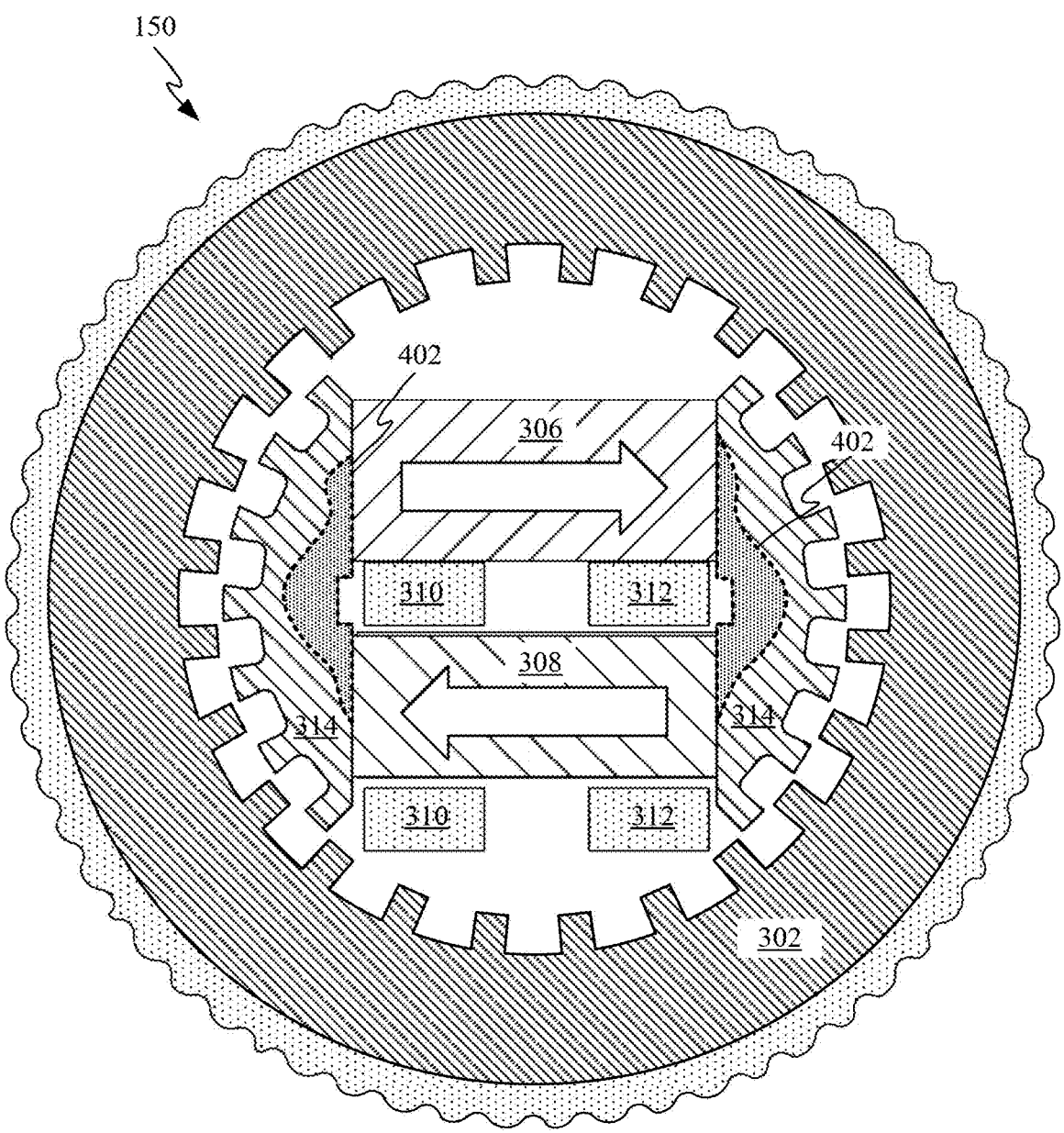
FIG. 4C shows another cross-sectional view of a rotary input control in which a polarity of a permanent magnet has been reversed, according to certain embodiments.

FIG. 4C shows another cross-sectional view of rotary input control 150 in which a polarity of permanent magnet 308 has been reversed. This results in the magnetic flux 402 being contained within ferromagnetic poles 314 since the polarity of the permanent magnets allows magnetic flux 402 to circulate within the magnetic circuit defined by permanent magnets 306/308 and ferromagnetic poles 314. This results in there being little to no interaction between electro permanent magnet 300 and ferromagnetic wheel 302, which allows a user to experience no tactile feedback during rotation of rotary input control 150. In practice, this may feel like a constant low friction resistance profile (e.g., a "free wheel" mode of operation).

In some embodiments, multiple coils may be used to incorporate more than two modes of operation, which is typically an "on" state where there is magnet-induced rotational friction, as shown in FIGS. 4A-4B, and an "off" state where there is little to no magnet-induced rotation friction, as shown in FIG. 4C. For example, two or more EPMs can each individually be turned "on" (fully energized; current flow) or "off" (fully de-energized; no current flow) in a number of different combinations to achieve varying amounts of magnetic coupling between protruding teeth 316 and teeth 304. The two or more EPMS can be co-located, configured in series, configured in parallel, configured in series-parallel, or other suitable configuration.

EM Driver

Figure 5:
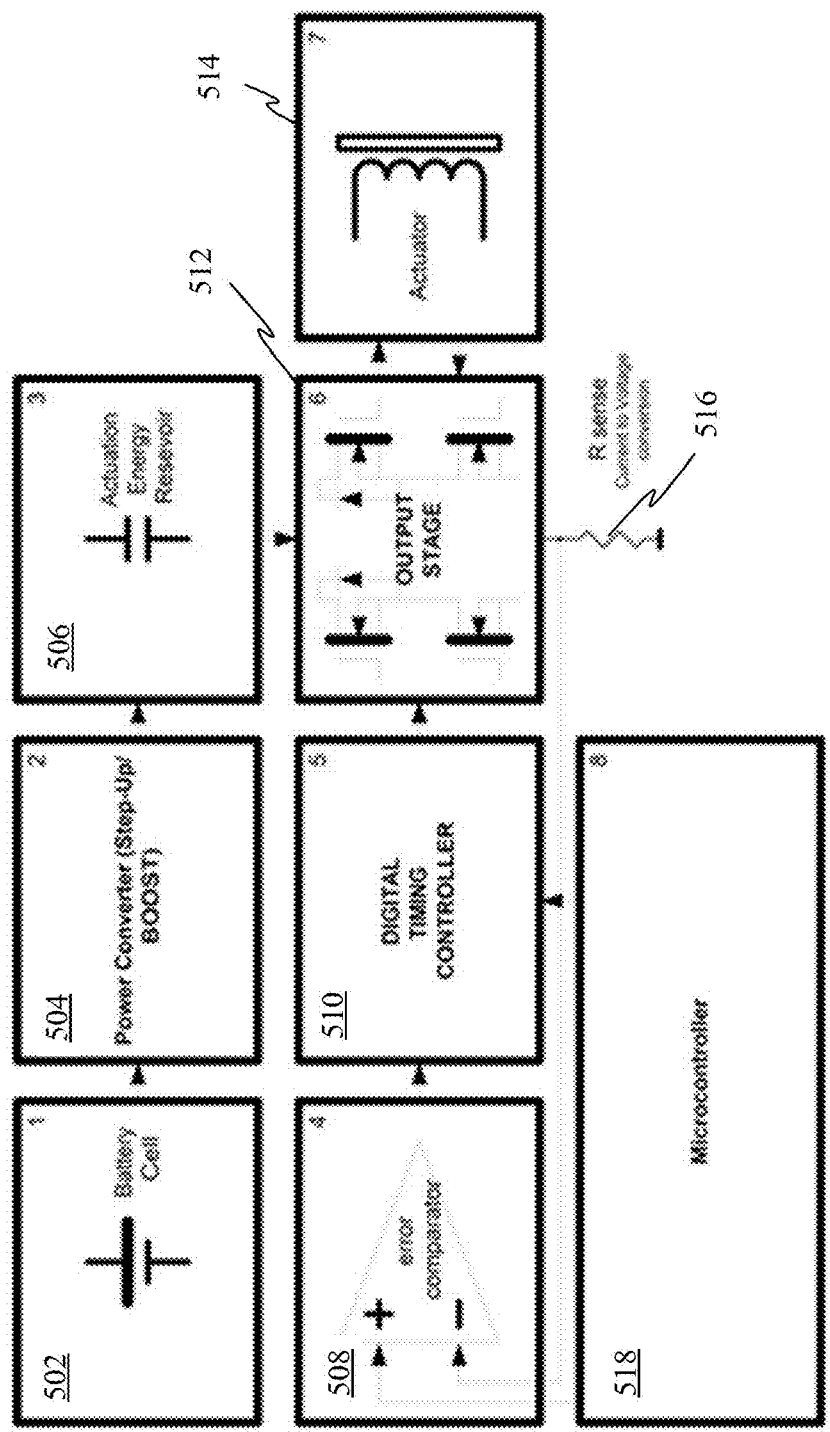
FIG. 5 is a system diagram of a force controller architecture, according to certain embodiments.

FIG. 5 is a system diagram of a force controller architecture, according to certain embodiments. A battery cell 502 sources the energy required to power the circuit. A power converter 504 transfer the charge from the battery cell, and accumulates it, in the main discharge capacitor, which is the energy reservoir 506. The energy reservoir 506 stores the energy directly applied to an actuator 514 through an output stage 512.

An error comparator 508 continuously monitors the difference between the instant actuator current and the current requested by a microcontroller 518. A digital timing controller 510 starts an actuation cycle upon a command from the microcontroller 518, but stops it once a reference level is reached. The reaching of the reference level is signaled by an output of comparator 508.

Output stage 512 is digital, with transistors that act only as switches. In one embodiment, the transistors form an H-bridge. Actuator 514 is an electro-permanent magnet (EPM) in one embodiment. The instantaneous current sets the magnetization of EPM magnet. A current sensing resistor 516 provides feedback to the error comparator 508, converting the current through the winding (inductor) of the electro-permanent magnet of actuator 514 into a voltage that can be applied to the error comparator. Microcontroller 518 performs multiple functions, in particular providing the peak reference actuator current level and the command to the digital timing controller 510 to start the actuation cycle.

Figure 6:
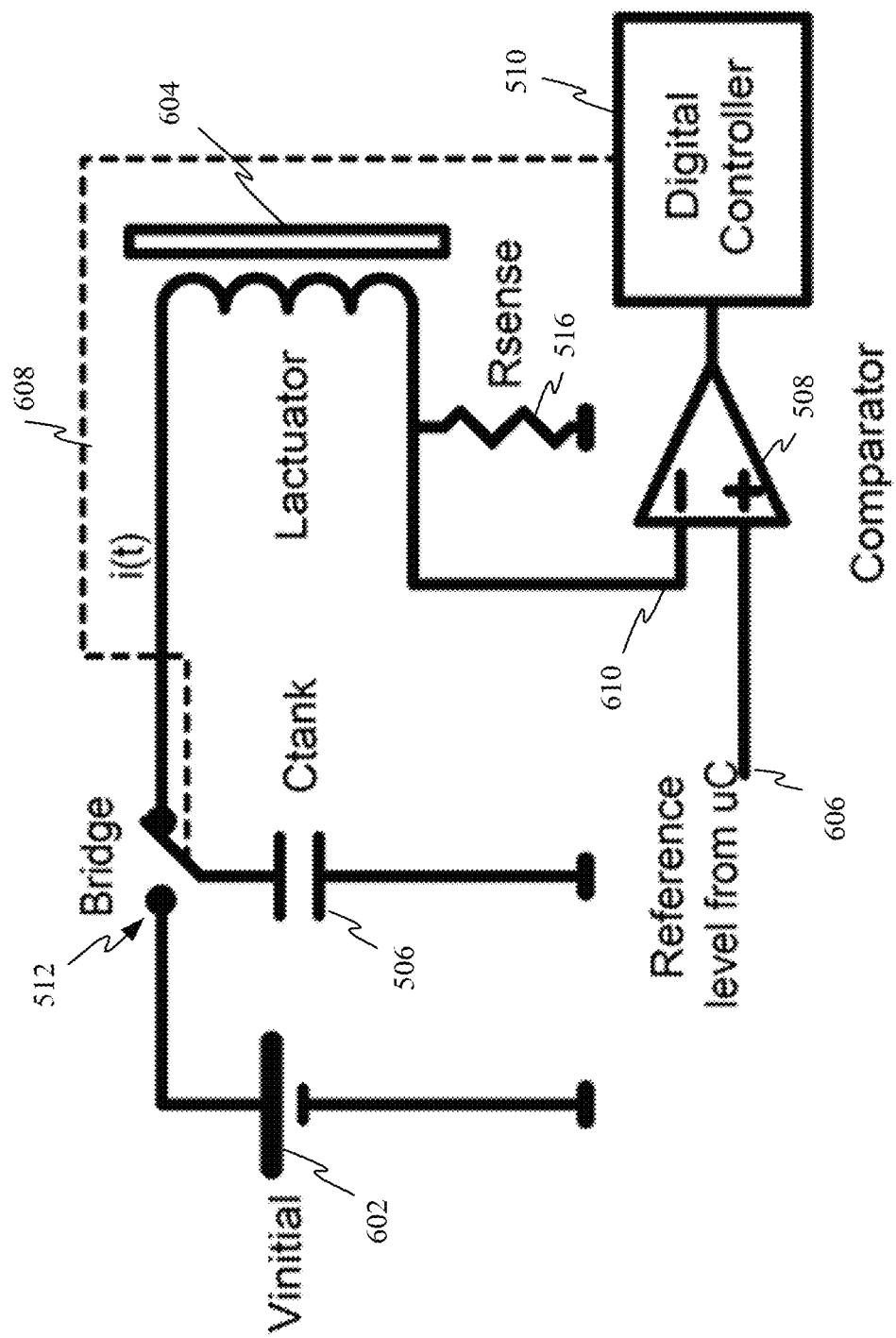
FIG. 6 is a simplified circuit diagram for charging an electromagnet, with a switch in a charge position, according to certain embodiments.

FIG. 6 is a simplified circuit diagram for charging an electromagnet, with a switch in a charge position, according to certain embodiments. FIG. 6 illustrates capacitor 506 connected through the H-bridge of output stage 512 to an electromagnet 604 of the actuator 514. Also shown is the sensing resistor 516 connected to an input of comparator 508 which provides its output to digital controller 510. Comparator 508 also receives a reference level from the microcontroller on line 606 and a voltage from current sensing resistor 516 on line 610. Digital controller 510 controls bridge 512 through control line 608. An initial voltage 602 is applied to the bridge 512, although in FIG. 6 the bridge has already switched to apply the voltage on capacitor 506 to the coil of electromagnet 604.

In an embodiment where electromagnet 604 is an inductive actuator (e.g., Electro Permanent Magnet, Solenoid), the main parameters either shown in FIG. 6 or discussed with respect to the equations below include:

L_actuator (or L)—inductance of the actuator 604;
C_tank (or C)—is the tank capacitance;
V_initial (or $V_o$)—is the C tank initial voltage before the discharge via the actuator;

R_total (or R)—parasitic series resistance of the bridge (switch) 512, current sensing resistor 516 and aforementioned ESR of inductor 604 and the capacitor 506;
I_target—target peak current for the drive circuit;
I_delta_error—current overshoot; and
$T_{ctrl}$—propagation delay in Error Comparator (508 in FIG. 5), Digital Timing Controller (510 in FIG. 5) and the output stage (e.g., H-bridge).

Figure 7:
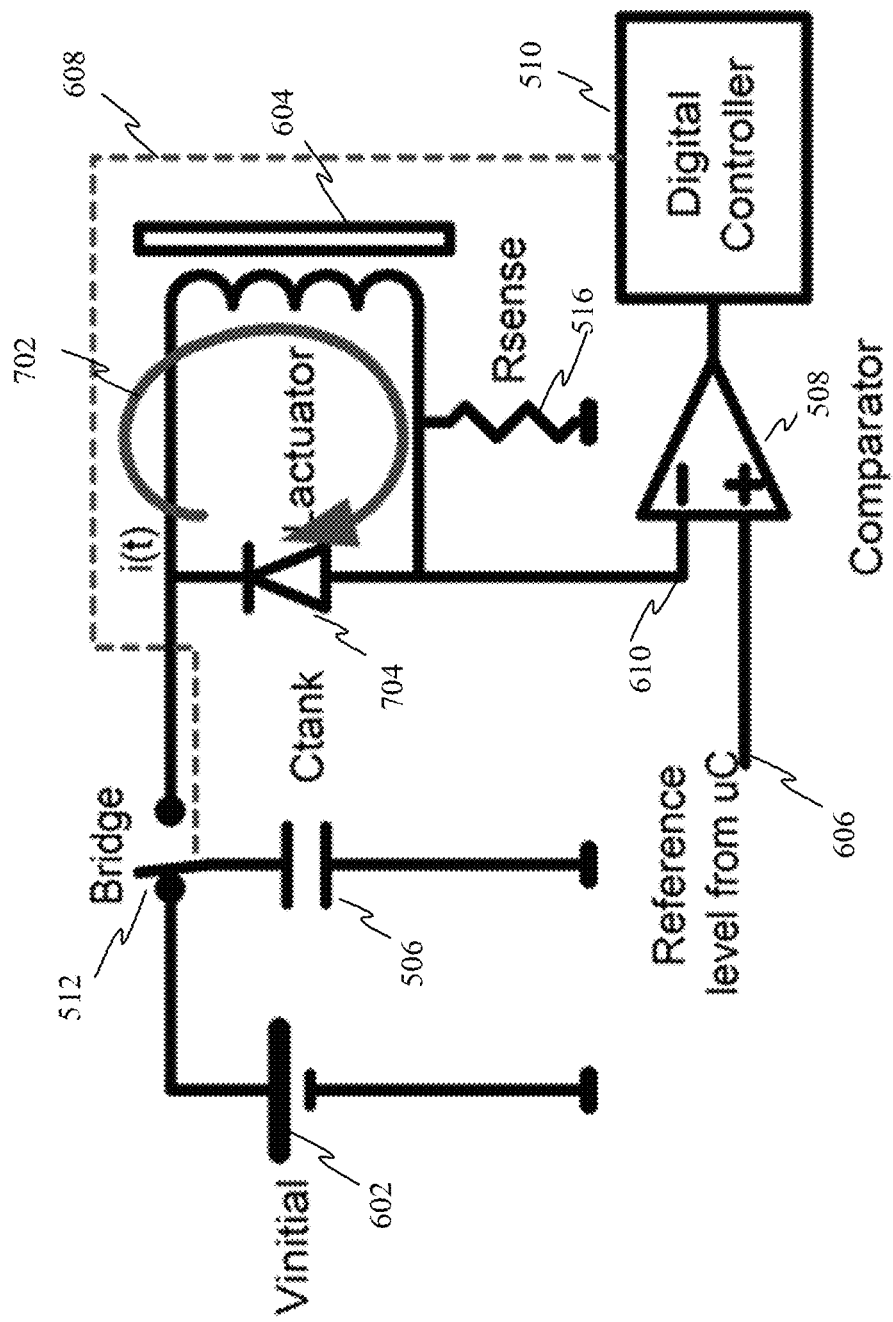
FIG. 7 is a simplified circuit diagram for charging an electromagnet, with a switch in a shut-off position, according to certain embodiments.

FIG. 7 is the simplified circuit diagram for charging an electromagnet as in FIG. 6, with the switch in a shut-off position, according to certain embodiments.

At the initial condition shown in FIG. 7, C tank capacitor 506 is charged by the initial voltage V_initial 602. Digital controller 510 through control line 608 controls bridge 512 to connect capacitor 506 to the initial voltage 602 for charging of the capacitor. Upon the command from the microcontroller to the digital controller 510, the digital controller 510 enables the bridge 512 to switch to connect to electromagnet 604 as shown in FIG. 6, and the current starts flowing from the C tank capacitor 506 via the bridge 512, actuator 604 and the current sense resistor 516 back to the capacitor (via ground). The connection of the capacitance C of capacitor 506 to the inductance L of electromagnet 604 forms an LC tank circuit. The current can be expressed by equations (1) below for underdamped oscillations in the improvised LC tank:

$$i(t) = \frac{V_0}{\omega_d L} e^{-\alpha t} \sin \omega_d t, \text{ where} \quad (1)$$

$$\omega_d = \sqrt{\omega_0^2 - \alpha^2}, \; \omega_0 = \frac{1}{\sqrt{LC}}, \; \alpha = \frac{R}{2L}$$

where:
$\omega_d$=Damped oscillation frequency, $\omega_0$=natural oscillation frequency of the LC system Due to the $t_{ctrl}$ propagation delay through the comparator, digital controller and the bridge, there is a systematic error, which affects the accuracy of the peak current setting. In other words the system overshoots by:

$$Err_i(t) = i(t+t_{ctrl}) - i(t) \quad (2)$$

Even though the control delay $t_{ctrl}$ can be assumed as constant, the current systematic current error isn't constant, but rather the function of time (or the reference current and therefore the time termination point). The further the current progresses from 0 towards its peak value, the lesser the systematic error is.

There is no problematic oscillation in this type of drive system since immediately after the moment when the bridge is disengaged by the controller, a freewheeling diode 704 is activated, closing the current path from the actuator inductor as shown in FIG. 7 with current path 702.

An RLC circuit is formed by capacitor 506, inductor of electromagnet 604 and the resistance, R, of the parasitic series resistance of the bridge (switch) 512, current sensing resistor 516 and ESR of inductor 604 and the capacitor 506. Whether the RLC circuit is underdamped or critically damped depends on the inductance of the actuator, the capacitance of the tank capacitor and the resistance composed by the R sense 516 and all the parasitic series resistance of the circuit. The equation above for critically damped oscillation (where there is no oscillations possible even without the freewheeling diode) is the following:

$$i(t) = \frac{V_0}{L} e^{-at} \qquad (3)$$

The pulse driver of embodiments of the present invention takes advantage of advances in comparator technology together with the high current, small gate capacitance MOSFET transistors. The transistors in the H-bridge are a smaller size than required to deliver a constant current at the desired current level. This takes advantage of the fact that such transistors can handle a much higher current pulse than the rated constant current capacity. A smaller transistor has a smaller gate, with smaller gate capacitance, and thus a faster switching speed. A voltage to current conversion via controlled impedance is used for the feedback path, allowing the use of a comparator to simplify the control circuit. A fast comparator design for the feedback control is used to further provide the fast switching speed needed to limit the overshoot. A flip-flop that works like a Silicon Controlled Rectifier (SCR) is connected to the comparator output to provide the fast switching. The flip-flop transistors are configured as at least one Silicon Controlled Rectifier or at least two transistors configured as an SCR or a Flip-Flop.

The faster comparator is the smaller the error is between the desired current and the actual cut-off current value. The comparator is also precise in one embodiment. In order to increase the efficiency of the circuit, it's important to reduce the galvanic (ohmic) losses. The shunt resistor on which the current is measured is preferably minimized. Hence, the voltage swing at the comparator input is also reduced. Therefore the comparator is a precision class in order to sense a small voltage differential between the reference voltage (representing the desired current) and the shunt voltage drop (representing the immediate current in the H-bridge). In one embodiment, the comparator has a propagation delay of less than 300 nano-seconds, and a voltage differential between the reference voltage and the shunt voltage drop of less than 10 mV, at 8 mV in one embodiment. With a shunt resistance of 0.1 Ohm, +/−8 mV/0.1 Ohm=+/−80 mA.+/−80 mA/20 A=+/−0.4%. Thus, for an 8 mV voltage offset inside the comparator, the static current setting can be done with an error of +/−0.4%). The bigger difference is between the one time period of the self-oscillation frequency of the LC resonator and the comparator delay, the better it is for the precision settings of the output current. Since the current cut-off condition is based on the result of comparison of the Vref (reference voltage) vs the voltage across the shunt resistance, the smaller the voltage offset is in the comparator, the better the performance.

The switching delay is the sum of several contributing factors:

$$t_{ctrl} = t_{comparator} + t_{controller} + t_{bridge} \qquad (4)$$

The major contributor to the total control delay $t_{ctrl}$ is the delay within the bridge $t_{bridge}$. The controller delay $t_{controller}$ is negligible.

One of the design tradeoffs is the size of the H-bridge transistors, which are activated for a very brief time. The maximum pulse current is usually 10× higher than the continuous maximum current for the very same output transistors. Running in the pulse mode allows the choice of a much smaller transistors with smaller gate capacitance, making the circuit even faster. The faster the circuit is, the less time is needed to transition the output transistors from the high impedance state to a fully enhanced state, and therefore there are less losses.

This dependency helps to minimize the size of the transistors by knowing the maximum time required to reach the peak current (RLC is operating in the series resonance mode).

$$t_{peak} = \frac{\pi \sqrt{LC}}{2} \qquad (5)$$

In other words by varying the design parameters such as L of actuator 604 and C of the tank capacitor 506, it's possible to adjust the $t_{peak}$ value for the drive. The drive operates between 0 and $t_{peak}$ time.

In embodiments, the invention provides a pulse-resonance system where the control method causes the maximum duration of the rising pulse to be less or equal to π/2, where π/2 is the phase increment in radians corresponding to 90 degrees. π/2 of the dumped self-oscillation frequency $\omega_d$. The pulse afterwards switches to monotonic decay. Accordingly, by design, there is no tendency to oscillate. Since EPM linear force response doesn't require the full current flowing via the EPM winding, then the pulse method provides significant energy conservation, which allows a series of fast discharge pulses to be sent from the same storage capacitor. Also, it's possible to replenish the capacitor 10× faster since only 10% of the capacitor charge is used, instead of 100% as in the case of the prior resonance methods. Also during a calibration period, the systematic error (the constant error/offset due to the time delay) is calibrated and cancelled out (in a feed forward fashion as an offset or a calibration constant). This method works since the part of the current curve with the force response is linear. The calibration is discussed in more detail below with respect to FIGS. 17-20.

Figure 8:
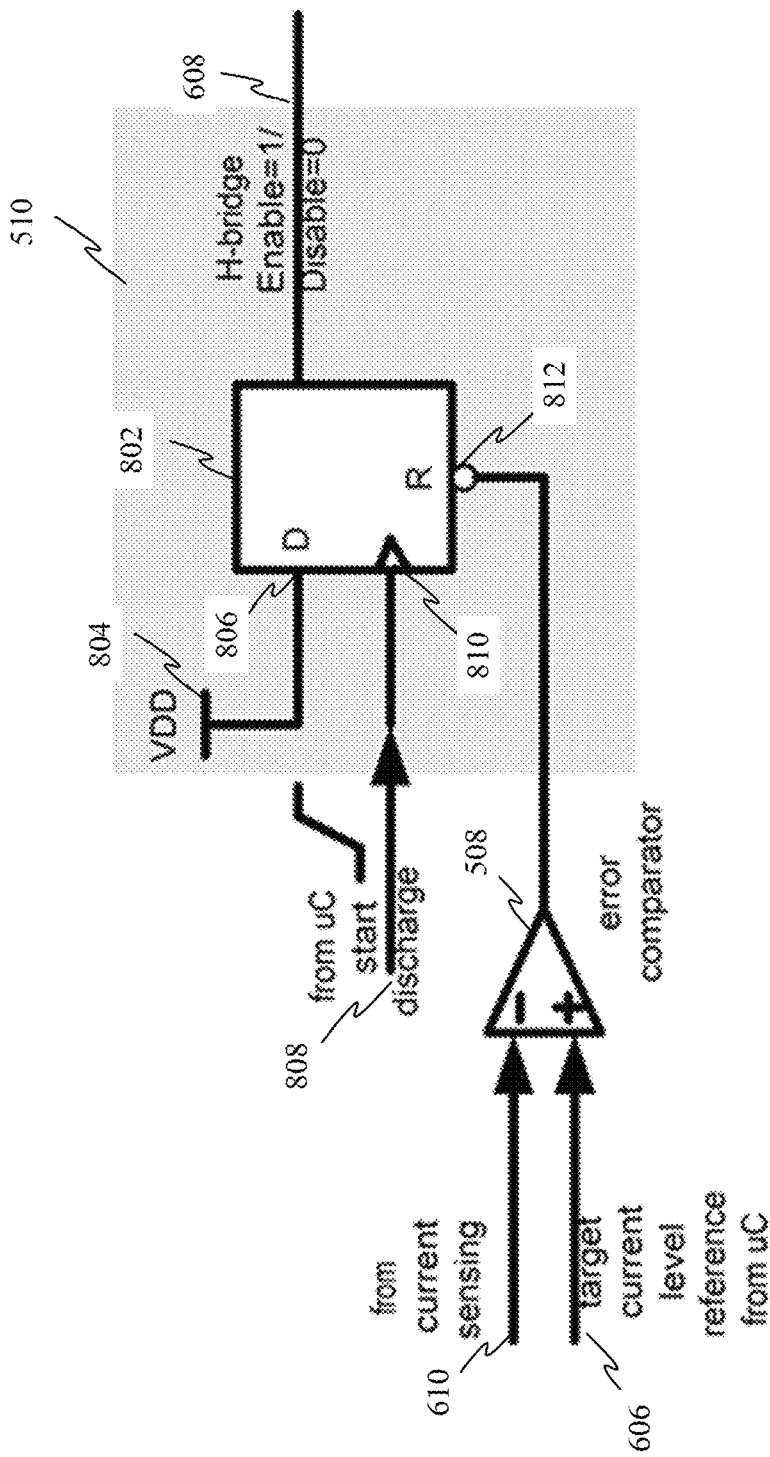
FIG. 8 is a simplified circuit diagram for the digital controller of FIGS. 6 and 7, according to certain embodiments.

FIG. 8 is a simplified circuit diagram for the digital controller 510 of FIGS. 6 and 7, according to certain embodiments. A simple flip-flop 802 can be used. In one embodiment, flip flop 802 is a D-type flip flop. A D flip flop is a clocked flip-flop that can be constructed from a gated SR flip-flop with an inverter added between the S and the R inputs to allow for a single D (Data) input. Then this single data input, labelled "D" is used in place of the "Set" signal, and the inverter is used to generate the complementary "Reset" input thereby making a level-sensitive D-type flip-flop from a level-sensitive SR-latch. Flip flop 802 can be implemented with discrete semiconductors or an integrated circuit (IC).

In FIG. 8, the data (D) input 806 is simply connected to a voltage (VDD) 801 to always have a high level (digital one) applied. A clock input 810 is connected by a line 808 to the microcontroller, which provides a signal on this line to start the discharge of the capacitor. As shown, error comparator 508 compares two inputs, a voltage corresponding to the sensed current from resistor 516 on line 610 and the target current level reference from the microcontroller on line 606. Flip flop 802 is set upon the command of the microcontroller on line 808 to the set input 810 to start the actuation cycle. Flip flop 802 is reset at reset input 812 by the comparator 508 feedback.

Figure 9A:
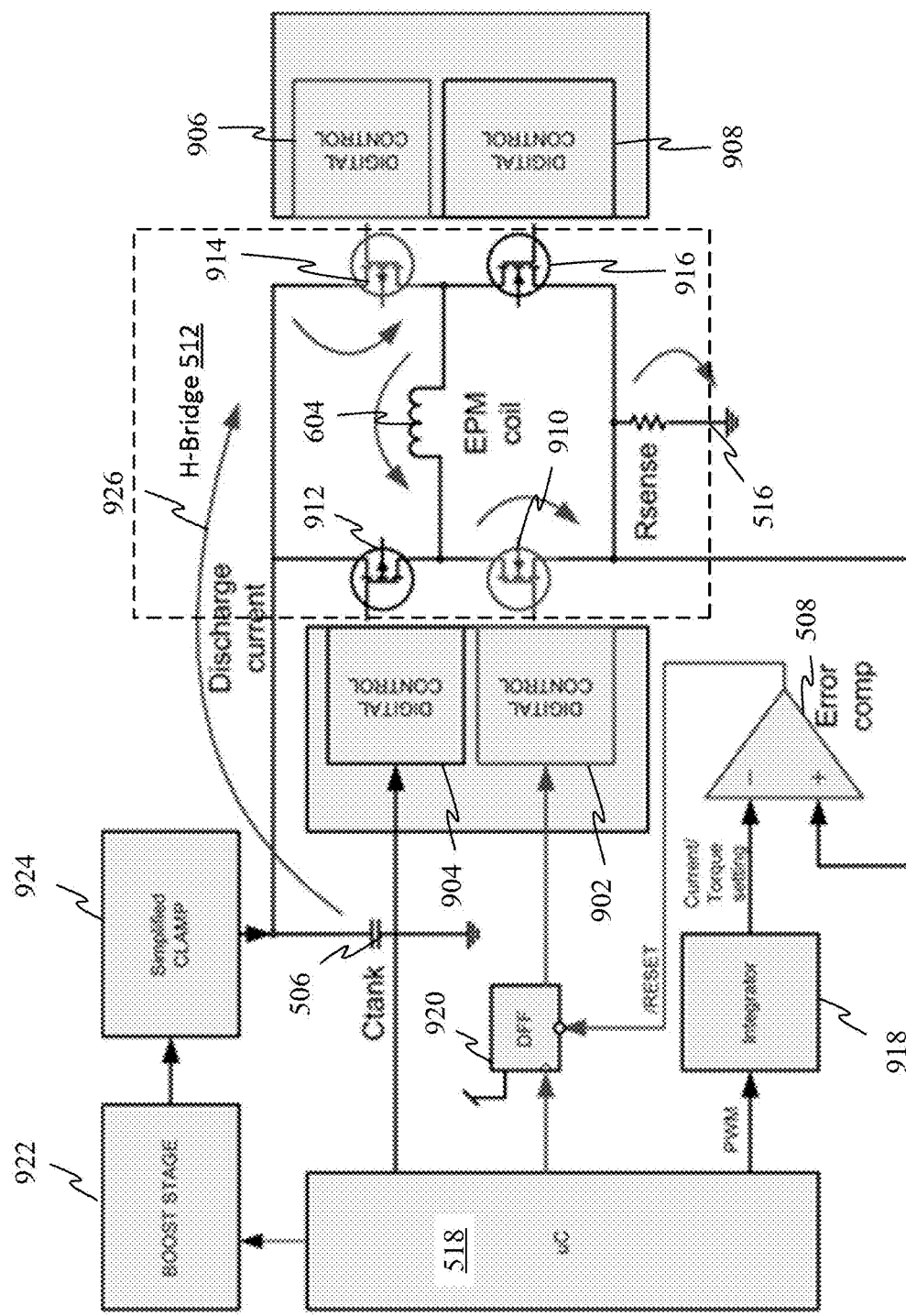
FIG. 9A is a block diagram of an electromagnet charging system, with a switch in a charging position, according to certain embodiments.

FIG. 9A is a block diagram of an electromagnet charging system, with a switch in a charging position, according to certain embodiments. While FIGS. 6 and 7 were simplified diagrams showing a single switch, FIG. 9A shows the full H-bridge configuration with four transistor switches 910, 912, 914, 916 controlled by four digital controllers 902, 904, 906, 908. Transistors 910 and 916 are NMOS transistors, and transistors 912 and 914 are PMOS transistors. An integrator 918 converts a pulse width modulation (PWM) control signal from microcontroller 518 into a voltage reference setting provided to error comparator 508.

A boost stage 922 connects to a simplified clamp 924 which connects to the capacitor 506. Boost stage 922 and clamp 924 implement boost block 504 of FIG. 5. Microcontroller 518 controls boost stage 922 and clamp 924 to provide the charging current from the battery (not shown, battery 502 of FIG. 5) to capacitor 506. Error comparator 508 provides a feedback signal to D flip-flop 920. This controls the switching on of transistor 910 in the H-bridge 512 (transistors 910, 912, 914, 916) as described previously. Although the control line is not shown in FIG. 9A, D flip-flop 920 also turns on H-bridge transistor 914, as described in more detail with respect to FIG. 9B below. With these two transistors turned on, this allows current flow from capacitor 506 as illustrated by arrow 926 and the other arrows showing flow through transistor 914, through EPM coil 604, through transistor 910 and through the sense resistor 518, which provides the feedback voltage to error comparator 508.

In the classic approach discussed in the Background, linear control of the output transistor is used, while the present invention embodiments use digital control. The classical linear control method requires the error amplifier to steer the output current of the EPM coil by linearly controlling the NMOS output transistor. In this case, the excessive power (20-30%) must be dissipated in the NMOS output transistor. This immediately reduces the efficiency of the circuit and also increases the complexity, since the possible stability problems (driving the inductive load with the very high current) can result in unwanted oscillations, as well as the current overshot at the beginning of the discharge cycle. Also, since the NMOS transistor in the linear control circuit runs in the linear mode, its size must be tailored to the amount of energy being dissipated, which makes the device expensive, bulky and unreliable (thermal cycling).

Figure 9B:
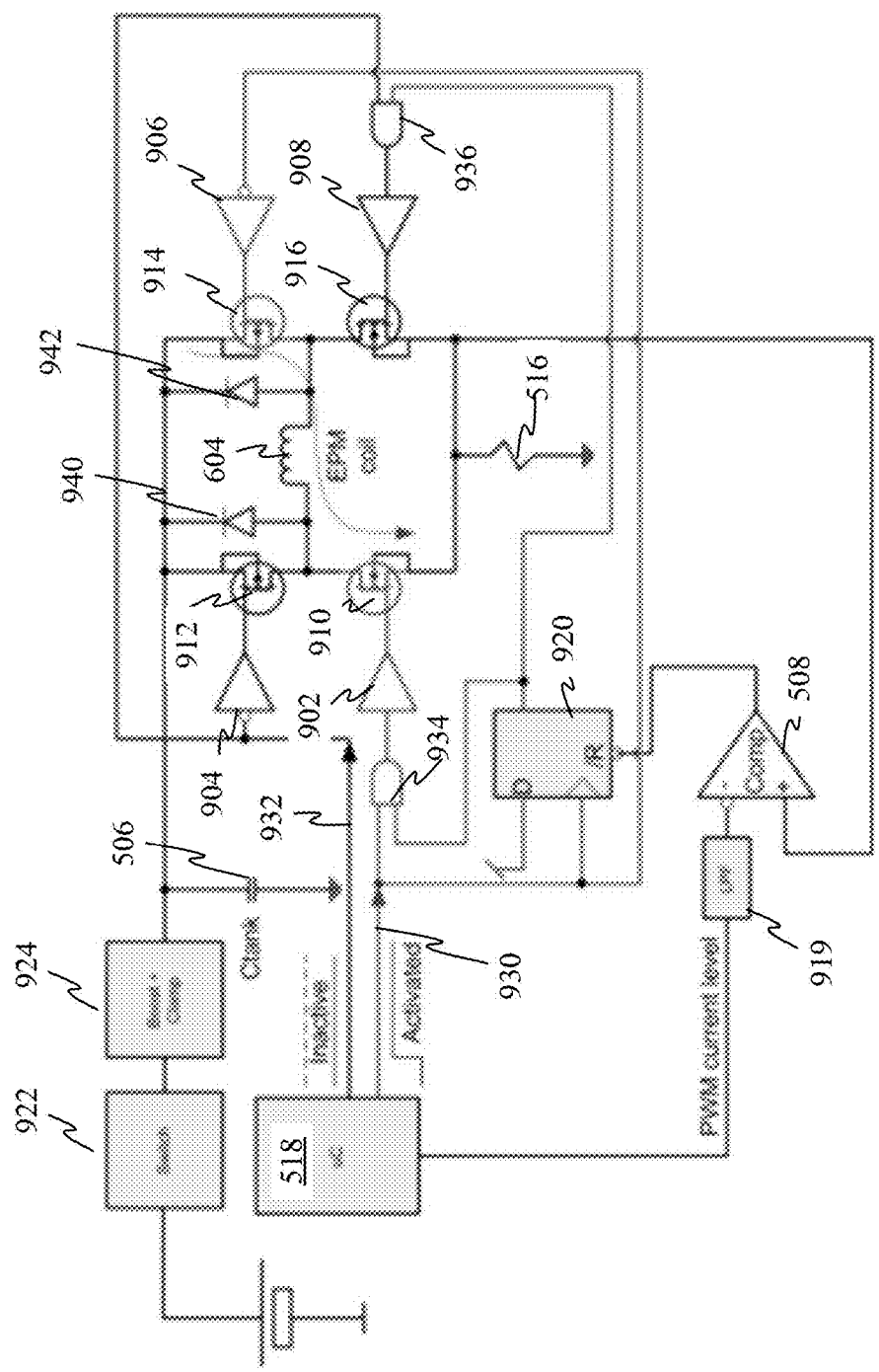
FIG. 9B is the block diagram of FIG. 9A with more control details added, according to certain embodiments.

However, the circuit of the embodiment of FIGS. 9A-B doesn't have a fast current control loop. It's digital. The output NMOS transistor is either disconnected or enhanced, therefore the energy dissipation in minimal. Additionally, thermal dissipation is tiny, which allows it to have a much smaller transistor footprint, making the device cheaper, smaller and more reliable. Finally, a lot of energy is conserved for the next EPM cycle.

FIG. 9B is the block diagram of FIG. 9A with more control details added, according to certain embodiments. When the microcontroller 518 is ready to start a new current pulse, the desired peak current level is provided, as a voltage, to an input of comparator 508. The voltage corresponding to the desired peak current is converted from a digital output of the microcontroller to an analog voltage value at the comparator input using a Digital to Analog Converter (DAC). The DAC comprises a Pulse Width Modulated (PWM) signal from the microcontroller, which is averaged by a Low Pass Filter (LPF) 919. The output of LPF 919 is applied to the positive terminal of the comparator.

Microcontroller (uC) 518 has 2 digital control lines for positive/negative discharge via EPM 604 (defines the H-bridge activation polarity). The first control line is activated control line 930, which goes high to order the EPM pulse. This low-high transition on line 930 sets the D Flip-Flop (DFF) 920 in an active state, where it can be reset by comparator 508 as discussed above. The D Flip-Flop output is one input to AND gate 934, with the other input being Activated control line 930. AND gate 930 triggers digital control/driver 902, which turns on N-MOS transistor 910 of the H-bridge. This is accomplished since on the low-high transition on the clock of the DFF 920 the logic one is latched into the DFF and enables the AND gate 934, enabling in turn the N-MOS driver 934. The corresponding P-MOS transistor 914 is directly enabled by the uC command on line 930 through digital controller/driver 906.

The current then starts rising via the EPM coil 604, and feedback is provided by measuring the voltage drop across the resistance (Rsense) of current measurement resistor 516. The current setting is calculated by using the following simple formula:
Ipeak=Vdac/Rsense. For example, if the Rsense is 0.1 Ohm and the target current is 10 Amps, it requires the DAC voltage to be set to 1V.
The current rises via the EPM coil, so the voltage drop goes up too via the current sense resistor.

To drive the current in the opposite direction, inactive control line 932 goes high, turning on PMOS transistor 912 and NMOS transistor 908. Transistor 908 is turned on through AND gate 936, similar to AND gate 934.

Figure 10:
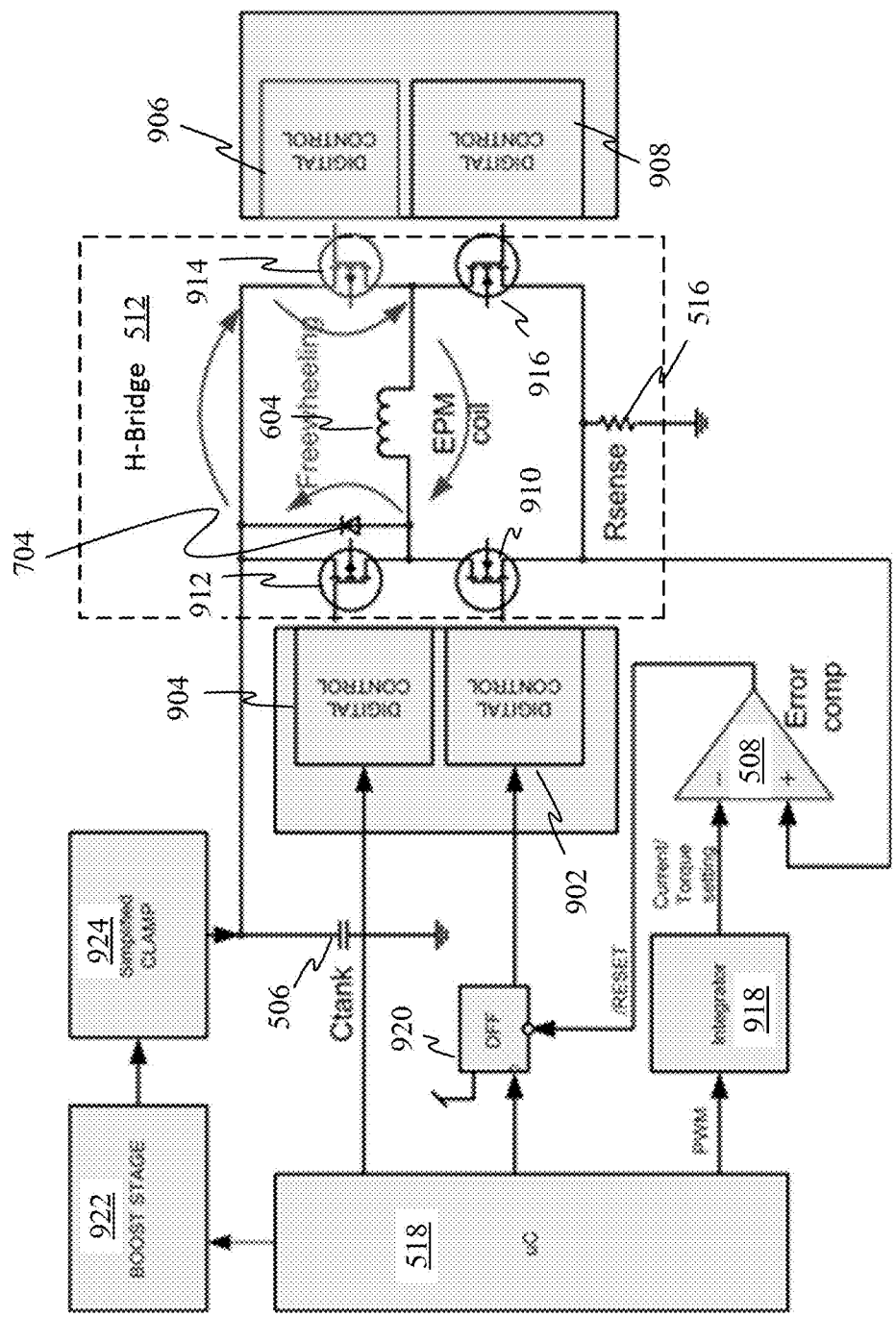
FIG. 10 is a block diagram of an electromagnet charging system, with a switch in a shut-off, freewheeling position, according to certain embodiments.

FIG. 10 is a block diagram of an electromagnet charging system, with the H-bridge switch in a shut-off, freewheeling position, according to certain embodiments. FIG. 10 is the same as FIG. 9A except for the addition of a diode 704 (see FIG. 7) in parallel with transistor 912 to allow a freewheeling mode. In this mode, the charging through the H-bridge 512 by capacitor 506 is stopped by turning off transistor 910. Transistor 914 remains on. Thus, as shown by the arrows, there is a circular current flow through transistor 914, EPM coil 604, diode 704, and back to transistor 914.

The capacitor discharge process is via the H-bridge. The digital controller is turned ON by the microprocessor, but the DFF 920 is already activated. This state is maintained under the timer function in the microprocessor for a fixed amount of time corresponding to the full amplitude EPM discharge cycle. The duration of this cycle starts with the activation of the H-bridge and the digital controller by the microprocessor. Roughly, this cycle equals $\pi$ or 180 degrees evolution of $\omega_0=1/\sqrt{LC}$ (natural oscillation frequency). After this period of time, the digital controller is switched off by the microprocessor, leading to switching off the transistor 914 (or 912 depending on which pair of transistors or in which direction the current is flowing through the EPM coil winding 604). After that the system is brought to the IDLE state.

Turning back to FIG. 9B, at some point the voltage across the current sense resistor 516 becomes slightly above the programmed DAC reference voltage representing the output current (1.0V as mentioned in the example above). In this case, the comparator 508 output goes to ZERO, resetting the DFF 920 and disabling, via the AND gate 934, the N-MOS transistor driver 902, turning off NMOS transistor 910. While the PMOS transistor 914 remains in the ON state, the NMOS transistor 910 is disconnected, since the DFF 920 is reset. From this moment, the current through the EPM coil 604 will stop rising and will start flowing via the freewheeling diode 940 of the opposite PMOS transistor 912. Diode 940 can be a body diode or an external diode.

For a current pulse in the opposite direction, the mirror circuit is used. NMOS transistor 916 is turned off, and the current through the EPM coil 604 will stop rising (falling) and will start flowing via the freewheeling diode 942 of the opposite PMOS transistor 914.

In one implementation, the final circuit is highly optimized with optimized circuits replacing the AND gates and the DFF using techniques known to those of skill in the art.

For example, a simple Silicon Controlled Rectifier (SCR) topology can be utilized to act as the flip-flop to block the action of the N-MOS transistors once the output current reaches its target, until the end of the discharge cycle.

Figure 11:
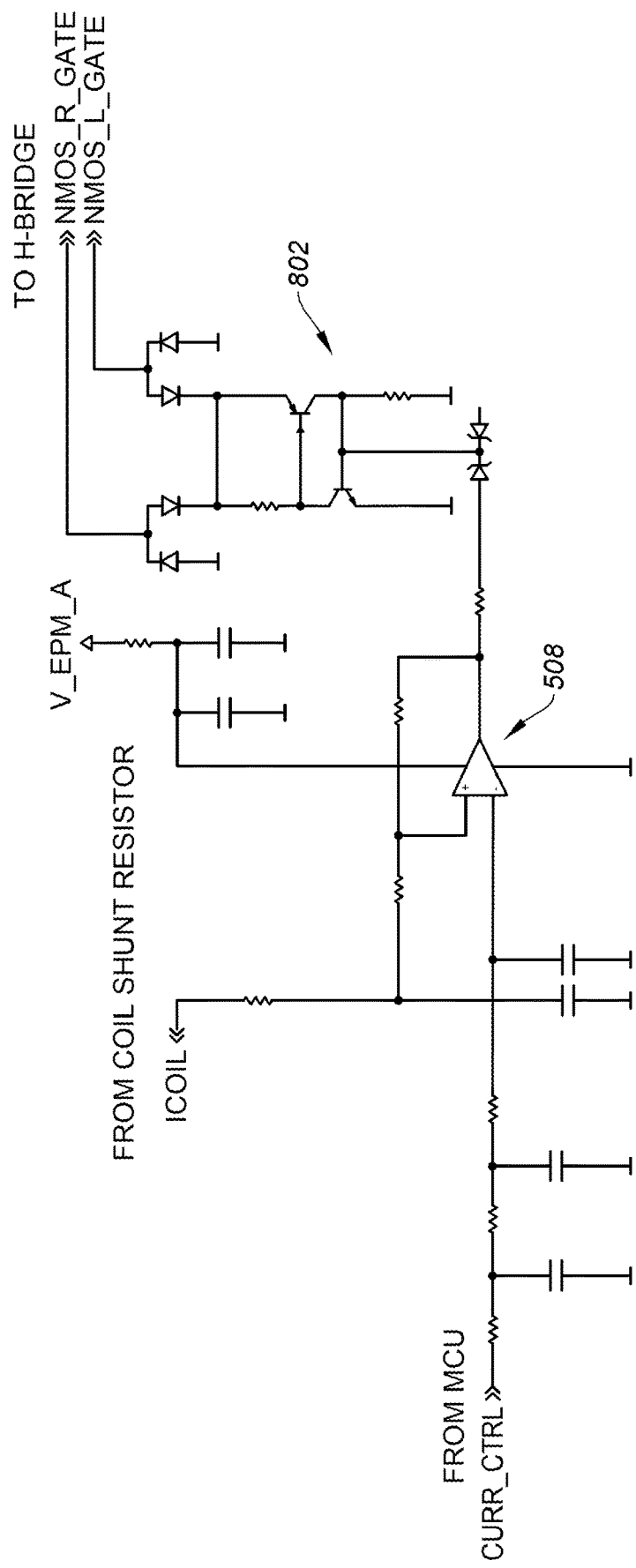
FIG. 11 is a circuit diagram of the comparator and triac (flip-flop) blocks of FIGS. 9-10, according to certain embodiments.

FIG. 11 is a circuit diagram of the comparator and triac (flip-flop) blocks of FIGS. 9-10, according to certain embodiments. The circuit shown includes comparator 508 and flip flop 802.

Figure 12:
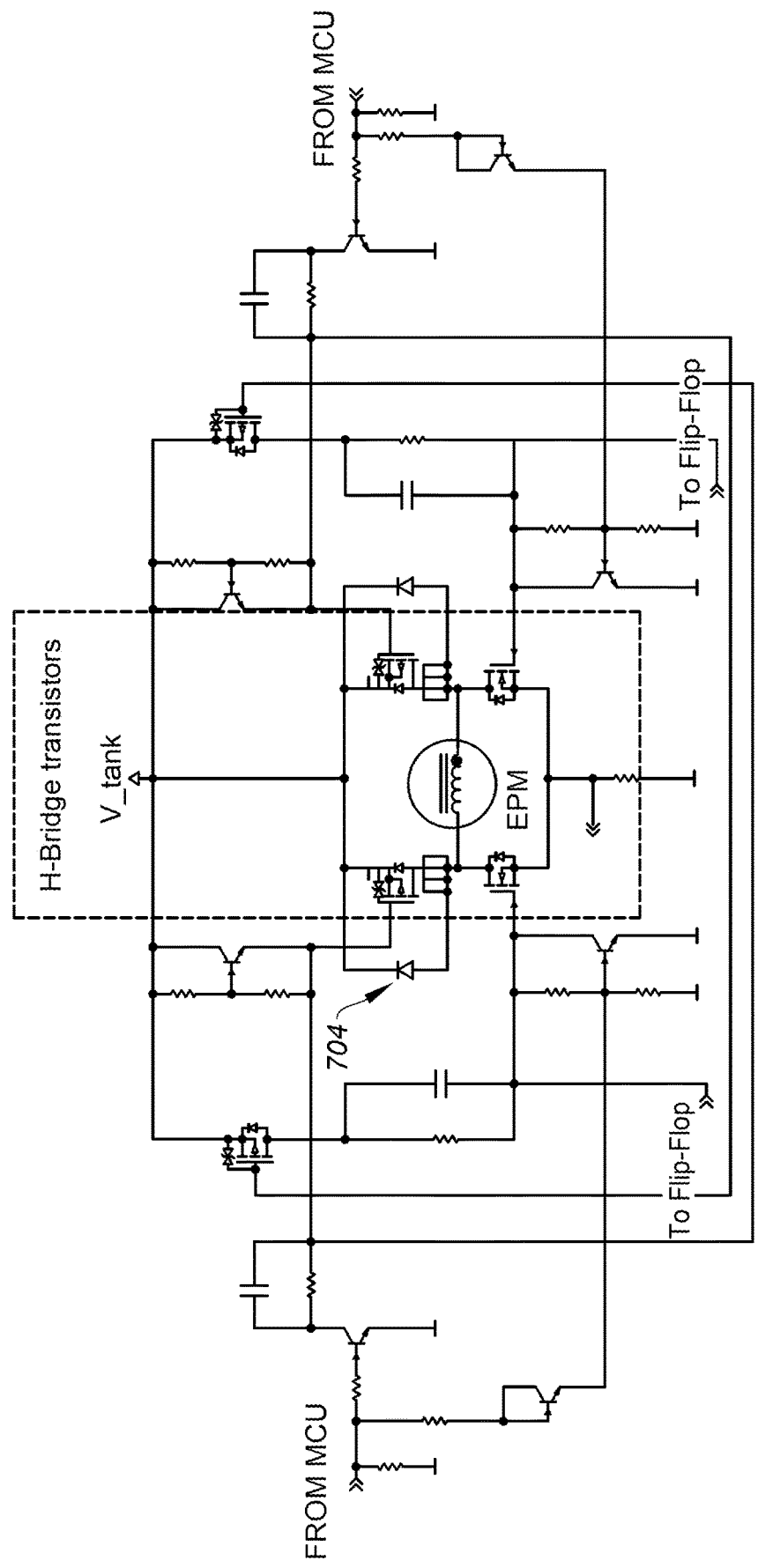
FIG. 12 is a circuit diagram of the Output Stage (H-Bridge) block of FIGS. 5 and 10, according to certain embodiments.

FIG. 12 is a circuit diagram of the Output Stage (H-Bridge) block of FIGS. 5 and 10, according to certain embodiments. Freewheeling diode 704 is also shown.

Figure 13A:
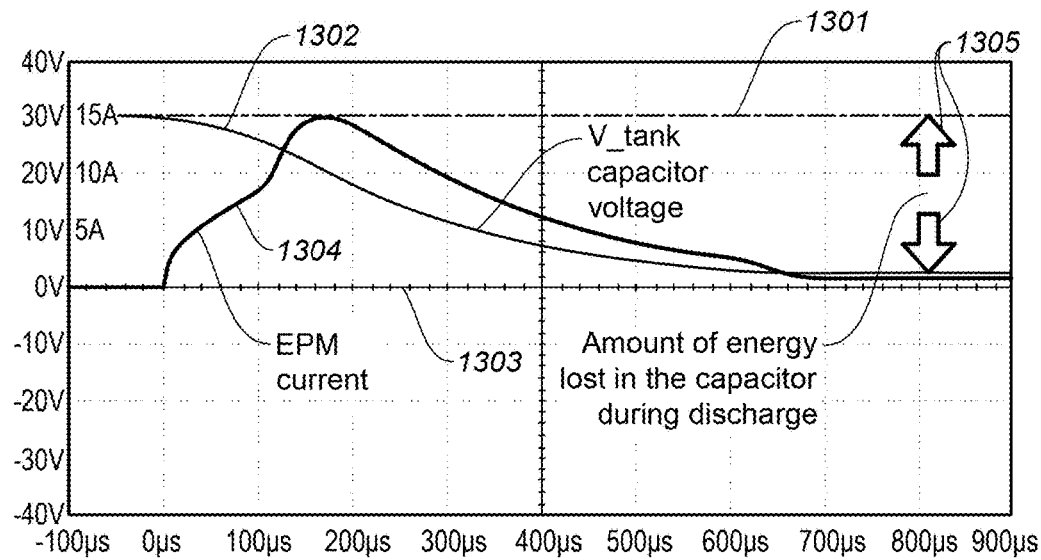
FIG. 13A is a graph showing a prior art charge and discharge cycle with a magnetization to saturation curve.

FIG. 13A is a graph showing a prior art charge and discharge cycle with a magnetization to saturation curve. Line 1302 shows the capacitor voltage, which starts at 29.4 volts in one embodiment. Line 1304 shows the current from the capacitor through the H-bridge to the EPM inductor. As can be seen, the current reaches a peak and then slowly declines to zero, completely dissipating the capacitor energy. The capacitor voltage starts at 29.4 volts at point 1301, and declines to 0V at point 1303. Arrows 1305 indicate the amount of energy lost in the capacitor during discharge. This is due to the current value being continuously controlled to prevent oscillations as discussed above. As a result, the capacitor will need to be completely recharged before another pulse can be generated.

Figure 13B:
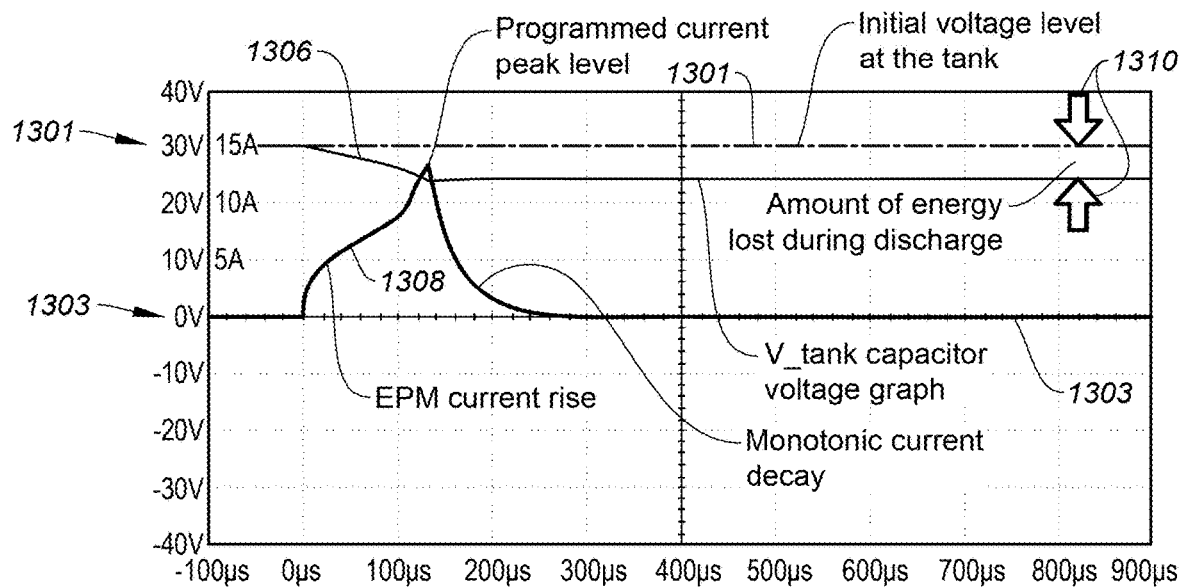
FIG. 13B is a graph showing a charge and shut-off cycle according to certain embodiments, without saturation.

FIG. 13B is a graph showing a charge and shut-off cycle according to certain embodiments, without saturation. Here, line 1306 illustrates the capacitor voltage and line 1308 represents the charging current. In contrast with FIG. 13A, the capacitor current is not constantly controlled, but rather is shut off shortly before reaching its peak. As can be seen, the current declines rapidly, preventing complete discharge of the capacitor. In the example shown, the capacitor voltage 1306 starts at 29.4 volts and terminates at 23.8 volts. Thus, approximately 65% of the capacitor energy is left after the cycle, as indicated by arrows 1310. This is actually a worst-case illustration, and more typically 80% of capacity energy will be left. Thus, the capacitor can be recharged much more quickly, enabling a subsequent pulse of current to be provided more rapidly. Embodiments of the invention can shut off in 10 s of nanoseconds and the overshoot is 1% or less. In one embodiment, the discharge time is about 100 microseconds, and only about 50 milliseconds full recharge time is required, giving a system about 500 times faster than the classic design. As can be seen, the current declines instantaneously (the current flowing through the capacitor and the shunt resistor 516, preventing the complete discharge of the capacitor 506). However, after the disconnection of the capacitor, the current continues flowing through the EPM, rapidly declining.

Thus, to summarize, in one embodiment, a circuit is provided with a battery 502, a multiple-ampere capacitor 506, and a charging circuit 504 connected between the battery and the capacitor. An actuator 524 is driven by an electromagnetic coil 604. A switching circuit 512 is connected between the multiple-ampere capacitor and the electromagnetic coil. The switching circuit includes an H-bridge 512 of four transistors 910, 912, 914 and 916. A diode 704 is configured in parallel with the electromagnetic coil to provide a current recirculation path when the capacitor is disconnected from the electromagnetic coil. A sensing resistor 516 is connected to the electromagnetic coil. A comparator 508 has a first input connected to the sensing resistor and a second input connected to a reference voltage 606. A digital controller 510 is connected to an output of the comparator. The digital controller is a D flip-flop 802, and is programmed to provide a signal on an output of the digital controller connected to the switching circuit to disconnect the capacitor from the electromagnetic coil when a current from the capacitor to the electromagnetic coil creates a voltage across the sensing resistor that reaches the reference voltage.

Figure 14:
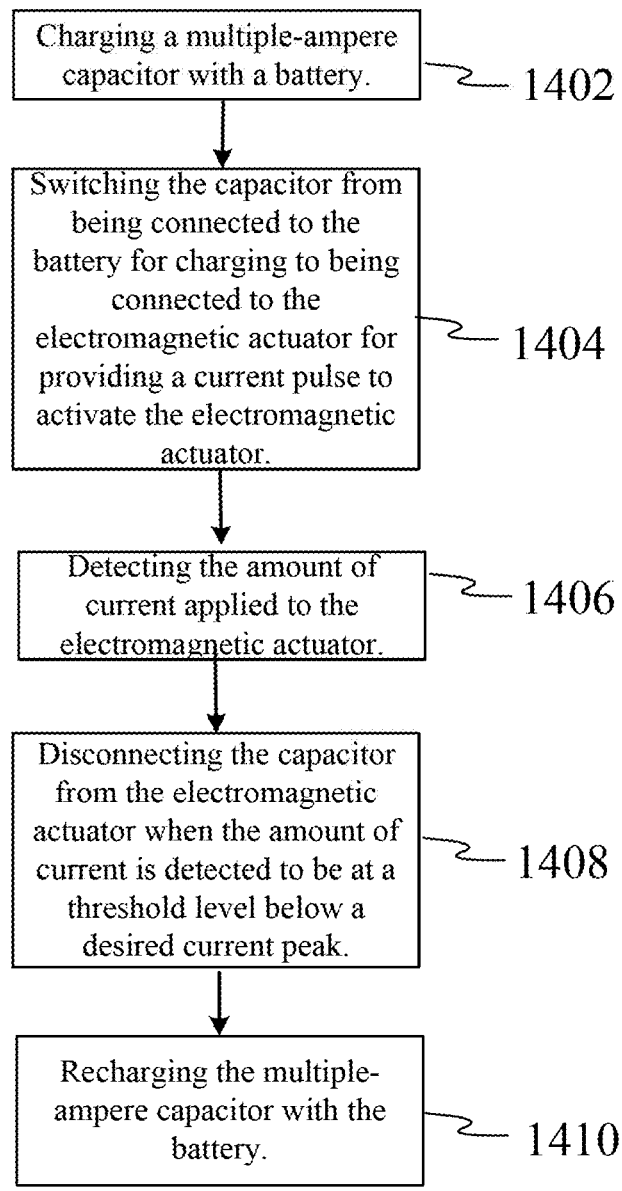
FIG. 14 illustrates one embodiment of a method of charging an electromagnetic actuator.

FIG. 14 illustrates one embodiment of a method of charging an electromagnetic actuator. Step 1402 is charging a multiple-ampere capacitor with a battery. Step 1404 is switching the capacitor from being connected to the battery for charging to being connected to the electromagnetic actuator for providing a current pulse to activate the electromagnetic actuator. Step 1406 is detecting the amount of current applied to the electromagnetic actuator. Step 1408 is disconnecting the capacitor from the electromagnetic actuator when the amount of current is detected to be at a threshold level below a desired current peak. Step 1410 is recharging the multiple-ampere capacitor with the battery.

Figure 15:
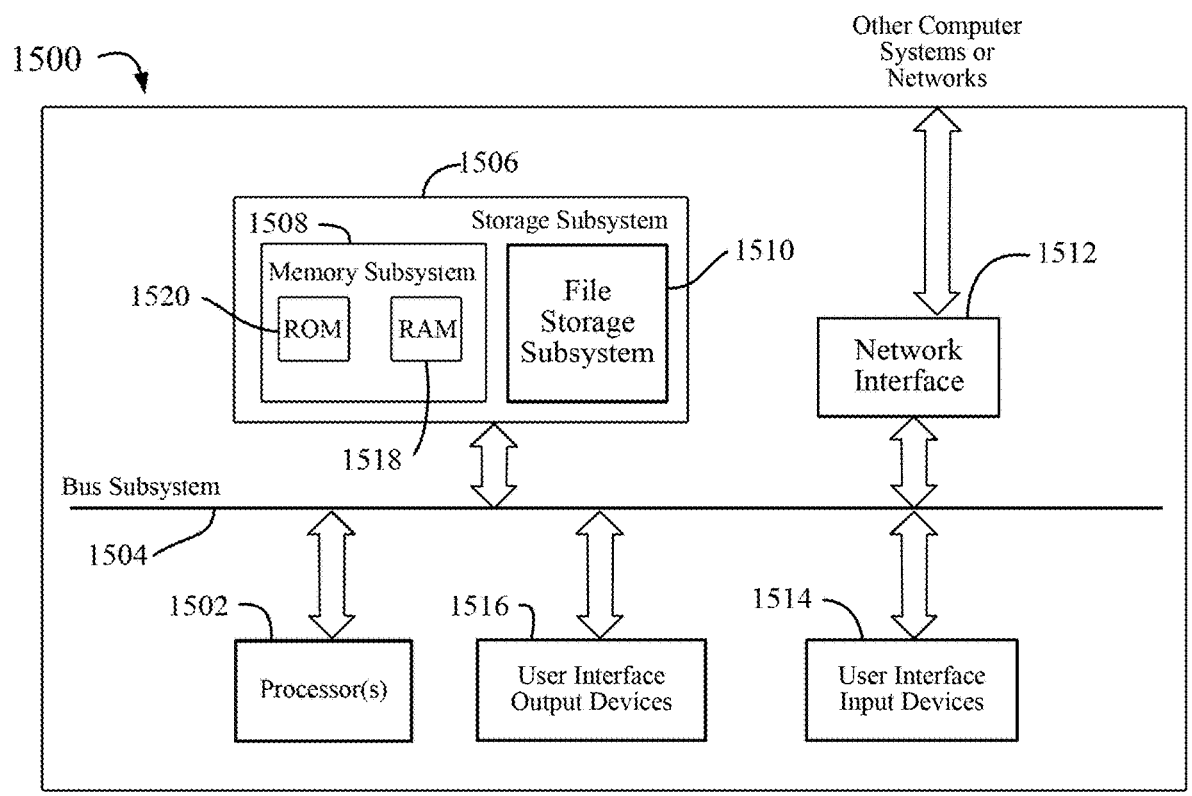
FIG. 15 illustrates a processing system for controlling certain features of peripheral devices disclosed herein.

FIG. 15 shows a system 1500 for operating a host computing device (e.g., host computing device 1510) system for controlling certain features of peripheral devices disclosed herein, according to certain embodiments. System 1500 can be used to implement any of the host computing devices or peripheral interface devices discussed herein and the myriad embodiments defined herein or within the purview of this disclosure but not necessarily explicitly described. System 1500 can include one or more processors 1502 that can communicate with a number of peripheral devices (e.g., input devices) via a bus subsystem 1504. These peripheral devices can include storage subsystem 1506 (comprising memory subsystem 1508 and file storage subsystem 1510), user interface input devices 1514, user interface output devices 1516, and network interface subsystem 1512. User input devices 1514 can be any of the input device types described herein (e.g., keyboard, computer mouse, remote control, etc.). User output devices 1516 can be a display of any type, including computer monitors, displays on handheld devices (e.g., smart phones, gaming systems), or the like, as would be understood by one of ordinary skill in the art. Alternatively or additionally, a display may include virtual reality (VR) displays, augmented reality displays, holographic displays, and the like, as would be understood by one of ordinary skill in the art.

In some examples, internal bus subsystem 1504 can provide a mechanism for letting the various components and subsystems of computer system 1500 communicate with each other as intended. Although internal bus subsystem 1504 is shown schematically as a single bus, alternative embodiments of the bus subsystem can utilize multiple buses. Additionally, network interface subsystem 1512 can serve as an interface for communicating data between computer system 1500 and other computer systems or networks. Embodiments of network interface subsystem 1512 can include wired interfaces (e.g., Ethernet, CAN, RS232, RS485, etc.) or wireless interfaces (e.g., Bluetooth®, BLE, ZigBee®, Z-Wire®, Wi-Fi, cellular protocols, etc.).

In some cases, user interface input devices 1514 can include a keyboard, a presenter, a pointing device (e.g., mouse, trackball, touchpad, etc.), a touch-screen incorporated into a display, audio input devices (e.g., voice recognition systems, microphones, etc.), Human Machine Interfaces (HMI) and other types of input devices. In general, use of the term "input device" is intended to include all possible types of devices and mechanisms for inputting information into computer system 1500. Additionally, user interface output devices 1516 can include a display subsystem, a printer, or non-visual displays such as audio output devices, etc. The display subsystem can be any known type of display device. In general, use of the term "output device" is intended to include all possible types of devices and mechanisms for outputting information from computer system 1500.

Storage subsystem 1506 can include memory subsystem 1508 and file storage subsystem 1510. Memory subsystems 1508 and file storage subsystem 1510 represent non-transitory computer-readable storage media that can store program code and/or data that provide the functionality of embodiments of the present disclosure. In some embodiments, memory subsystem 1508 can include a number of memories including main random access memory (RAM) 1518 for storage of instructions and data during program execution and read-only memory (ROM) 1520 in which fixed instructions may be stored. File storage subsystem 1510 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 1500 is illustrative and not intended to limit embodiments of the present disclosure. Many other configurations having more or fewer components than system 1500 are possible. The various embodiments further can be implemented in a wide variety of operating environments, which in some cases can include one or more user computers, computing devices or processing devices, which can be used to operate any of a number of applications. User or client devices can include any of a number of general purpose personal computers, such as desktop or laptop computers running a standard or non-standard operating system, as well as cellular, wireless and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially available protocols, such as TCP/IP, UDP, OSI, FTP, UPnP, NFS, CIFS, and the like. The network can be, for example, a local area network, a wide-area network, a virtual private network, the Internet, an intranet, an extranet, a public switched telephone network, an infrared network, a wireless network, and any combination thereof.

In embodiments utilizing a network server, the network server can run any of a variety of server or mid-tier applications, including HTTP servers, FTP servers, CGI servers, data servers, Java servers, and business application servers. The server(s) also may be capable of executing programs or scripts in response to requests from user devices, such as by executing one or more applications that may be implemented as one or more scripts or programs written in any programming language, including but not limited to Java®, C, C# or C++, or any scripting language, such as Perl, Python or TCL, as well as combinations thereof. The server(s) may also include database servers, including without limitation those commercially available from Oracle®, Microsoft®, Sybase® and IBM®.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a non-transitory computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or browser. It should be appreciated that alternate embodiments may have numerous variations from that described above. For example, customized hardware might also be used and/or particular elements might be implemented in hardware, software (including portable software, such as applets) or both. Further, connections to other computing devices such as network input/output devices may be employed.

Figure 16:
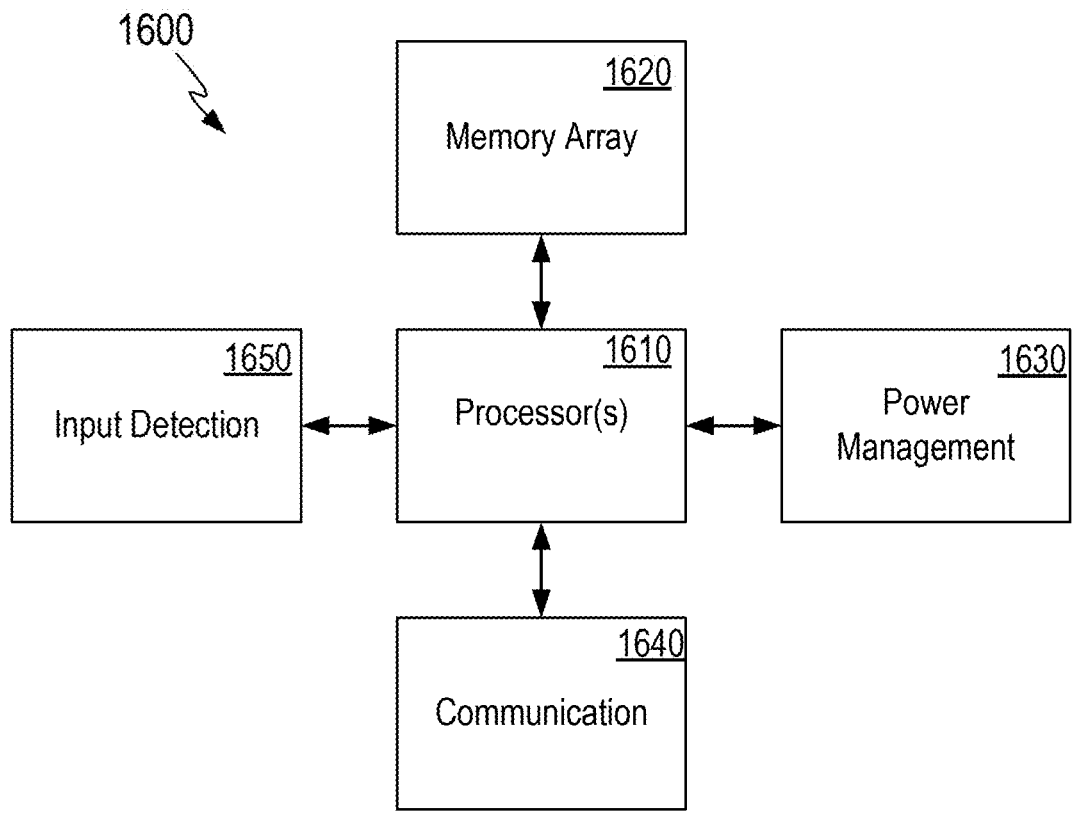
FIG. 16 shows another representation of a system for operating a peripheral device (e.g., a user input device such as a computer mouse), according to certain embodiments.

FIG. 16 shows a system 1600 for operating a peripheral device (e.g., user input device 100), according to certain embodiments. System 1600 includes processor(s) 1610, memory array 1620, power management system 1630, communication system 1640, and input detection module 1650. Each of the system blocks 1620-1650 can be in electrical communication with the processor(s) 1610 (e.g., via a bus system). System 1600 may further include additional systems that are not shown or discussed to prevent obfuscation of the novel features described herein. System blocks 1620-1650 may be implemented as separate modules, or alternatively, more than one system block may be implemented in a single module. Note that system 1500 and system 1600 provide examples of some typical systems that can be used to implement the various embodiments described here and any modifications, variations, and alternative implementations may be used, as would be appreciated by one of ordinary skill in the art with the benefit of this disclosure.

In certain embodiments, processor(s) 1610 comprises one or more microprocessors (μCs) and can be configured to control the operation of system 1600. Alternatively, processor(s) 1610 may include one or more microcontrollers (MCUs), digital signal processors (DSPs), or the like, with supporting hardware and/or firmware (e.g., memory, programmable I/Os, etc.), as would be appreciated by one of ordinary skill in the art. Processor(s) 1610 can control some or all aspects of operation of user input device 100 (e.g., system block 1620-1650). Alternatively or additionally, some of system blocks 1620-1650 may include an additional dedicated processor, which may work in conjunction with processor 1610. One of ordinary skill in the art would understand the many variations, modifications, and alternative embodiments thereof.

Memory array 1620 may be configured to store information pertaining to one or more operational configurations of user input device 100. As further discussed below, one or more operational configurations of user input device 100 may include setting performance characteristics of user input device 100, including but not limited to, a computer mouse scroll speed, a sensitivity of computer mouse movement sensor, mapping of keyboard hot keys, microphone volume, etc., and the like. Memory array 1620 may also store other configuration information used for communication with user input device 100, as further discussed below.

Additionally, memory array 1620 can store one or more software programs to be executed by processors (e.g., in processor(s) 1610). It should be understood that "software"

can refer to sequences of instructions that, when executed by processing unit(s) (e.g., processors, processing devices, etc.), cause system 1600 to perform certain operations of software programs. The instructions can be stored as firmware residing in read-only memory (ROM) and/or applications stored in media storage that can be read into memory for processing by processing devices. Software can be implemented as a single program or a collection of separate programs and can be stored in non-volatile storage and copied in whole or in-part to volatile working memory during program execution. More germane to the present disclosure, memory array 1620 (along with processor 1610) may include instructions (realized via software, firmware, hardware, and in any combination thereof) configured to implement the various electro permanent magnet control schemes described herein, such as determining the timing for cutting off the capacitor current, recharging the capacitor, and initiating a second EM charging pulse.

Power management system 1630 can be configured to manage power distribution, recharging, power efficiency, and the like, for user input device 100. In some embodiments, power management system 1630 can include a battery (not shown), a USB based recharging system for the battery (not shown), and power management devices (e.g., low-dropout voltage regulators—not shown). In certain embodiments, the functions provided by power management system 1630 may be incorporated into processor(s) 1610. The power source can be a replaceable battery, a rechargeable energy storage device (e.g., super capacitor, Lithium Polymer Battery, NiMH, NiCd), or a corded power supply. The recharging system can be an additional cable (specific for the recharging purpose) or it can use a USB connection to recharge the battery.

Communications system 1640 can be configured to provide wireless and/or wired communication between processors 1610 and one or more of user input device 100, according to some examples. Communications system 1640 can be configured to provide radio-frequency (RF), Bluetooth®, BLE, WiFi, infra-red (IR), ZigBee®, Logitech Unifying®, or other suitable communication technology to communicate with other computing devices and/or peripheral devices. Communications system 1640 may also provide hardwired connection with processors 1610. The hardwired connection can include a serial interconnect such as, for example, Universal Serial Bus (USB), FireWire®, DisplayPort®, etc.

One example of communication system 1640 can be a dongle, which can provide a combination of wireless and wired communication between processors 1610 and one or more of user input device 100. For example, the dongle may include a wired connector interface (e.g., a USB connector) which can be plugged into a hardwire interface port (e.g., a USB port). The hardwire interface port, in turn, is connected to processors 1610 via a hardwired interconnect (e.g., USB buses). Moreover, the dongle may also include a wireless interface (e.g., a Bluetooth® wireless interface) to perform wireless data transfer with user input device 100. The dongle can receive sensor data from user input device 100 via the wireless interface, and transmit the sensor data to processors 1610 via the hardwired interconnect.

Input detection module 1650 can control the detection of a user-interaction with input elements on user input device 100. For instance, input detection module 1650 can detect user inputs based on sensor data from computer mouse 130. In some embodiments, input detection module 1650 can work in conjunction with memory array 1620 to generate input data to processors 1610 based on the sensor data received from communication system 1640. For example, based on scrolling speed information stored in memory array 1620 as well as sensor data from computer mouse 130, input detection module 1650 can calculate a distance traversed by a mouse pointer on display 120, and provide the distance information to processors 1610 (or a renderer) to render the movement of the mouse on display 120.

Although certain systems may not expressly discussed, they should be considered as part of system 1600, as would be understood by one of ordinary skill in the art. For example, system 1600 may include a bus system to transfer power and/or data to and from the different systems therein.

It should be appreciated that system 1600 is illustrative and that variations and modifications are possible. System 1600 can have other capabilities not specifically described herein. Further, while system 1600 is described with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained.

Calibration

The calibration method is based on the instant EPM coil current measurement during a single EPM magnetization cycle and a curve distortion analysis where it's important to find the magnetization curve transition points (the correspondence between the magnetization current and the EPM torque/force (the torque is referred to as UX herein). The otherwise ideal half-sine current curve is heavily distorted and the distortion region is where the mechanical torque variation happens. The typical EPM magnetization curve is presented in FIG. 17. Trace 1701 is the current flowing through the EPM coil winding. The corresponding tank capacitor voltage is shown by curve 1706. The region between the two flex points (marked by arrows 1702, 1704) is the variable torque region, which the calibration routine needs to find. The smaller, insert graph shows consecutive torque pulses 1708, 1710 vs. the magnetization current. These curves are between the two torque or mechanical force saturation regions. The torque pulses are in a variable mechanical torque region, where the magnetization current modulates the EPM torque.

This EPM current curve distortion happens due to the variable magnetic permeability under the magnetization force during the full EPM magnetization cycle, which leads to the EPM wheel coil inductance dynamic variation. Hence, the inductance varies together with the permeability value. This distorts in return the magnetization curve from the quarter sinusoidal shape to the shape with two flex points 1702, 1704 on the slope (like a 3rd order curve). By analyzing the current curve and locating the flexing points (calculating the second derivative of the current and looking for zero crossings on the rising current slope), it's possible to construct the magnetization force curve alone by knowing 4 parameters:

(1) Upper and (2) Lower flex point current;

(3) Free wheel and (4) full ratchet saturated torque (value obtained from EPM manufacturer test bench—different each time for every EPM unit), which will result in the absolute calibration table with a very high precision.

Figure 17:
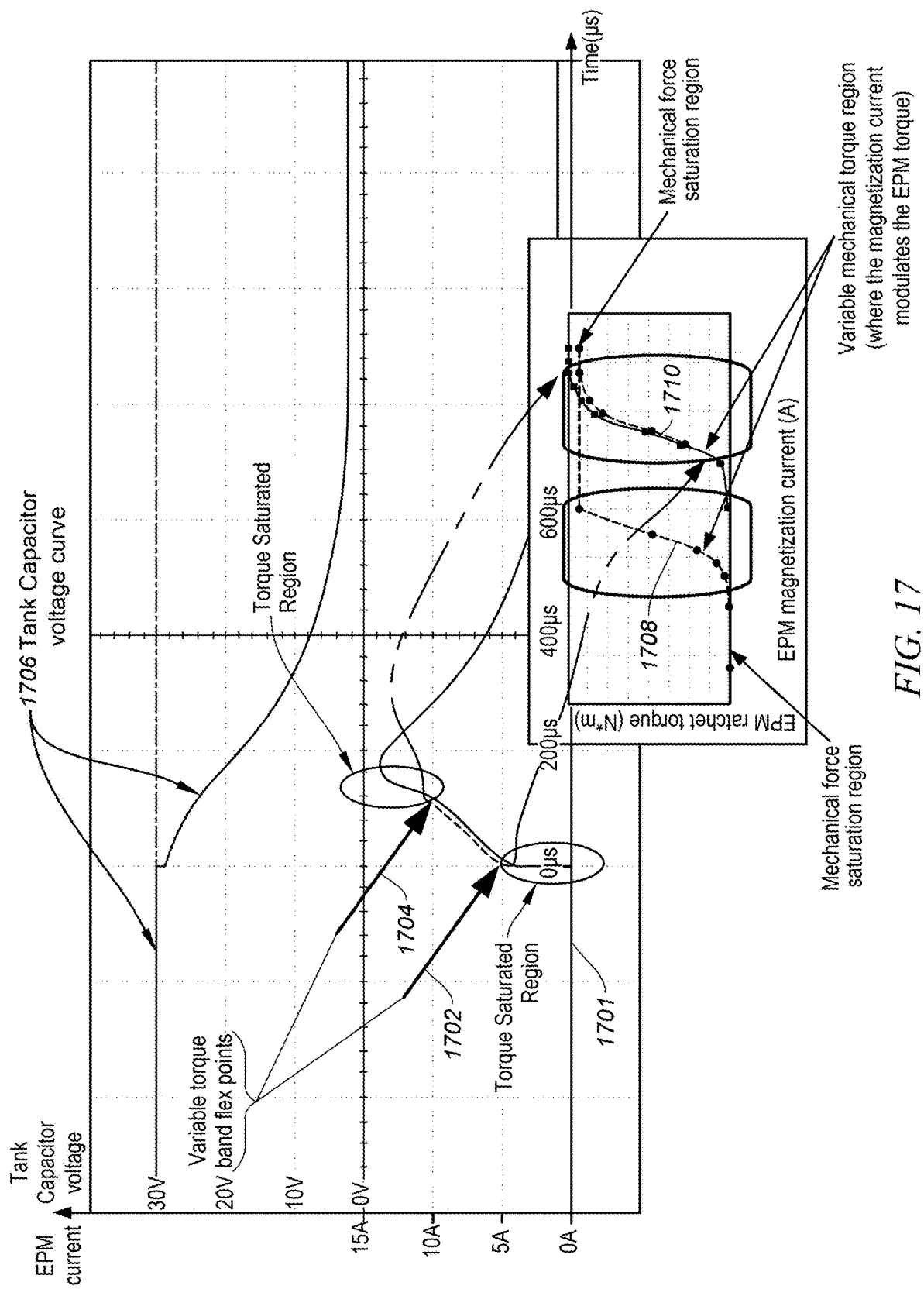
FIG. 17 is a graph illustrating a typical EPM magnetization curve.
Figure 18:
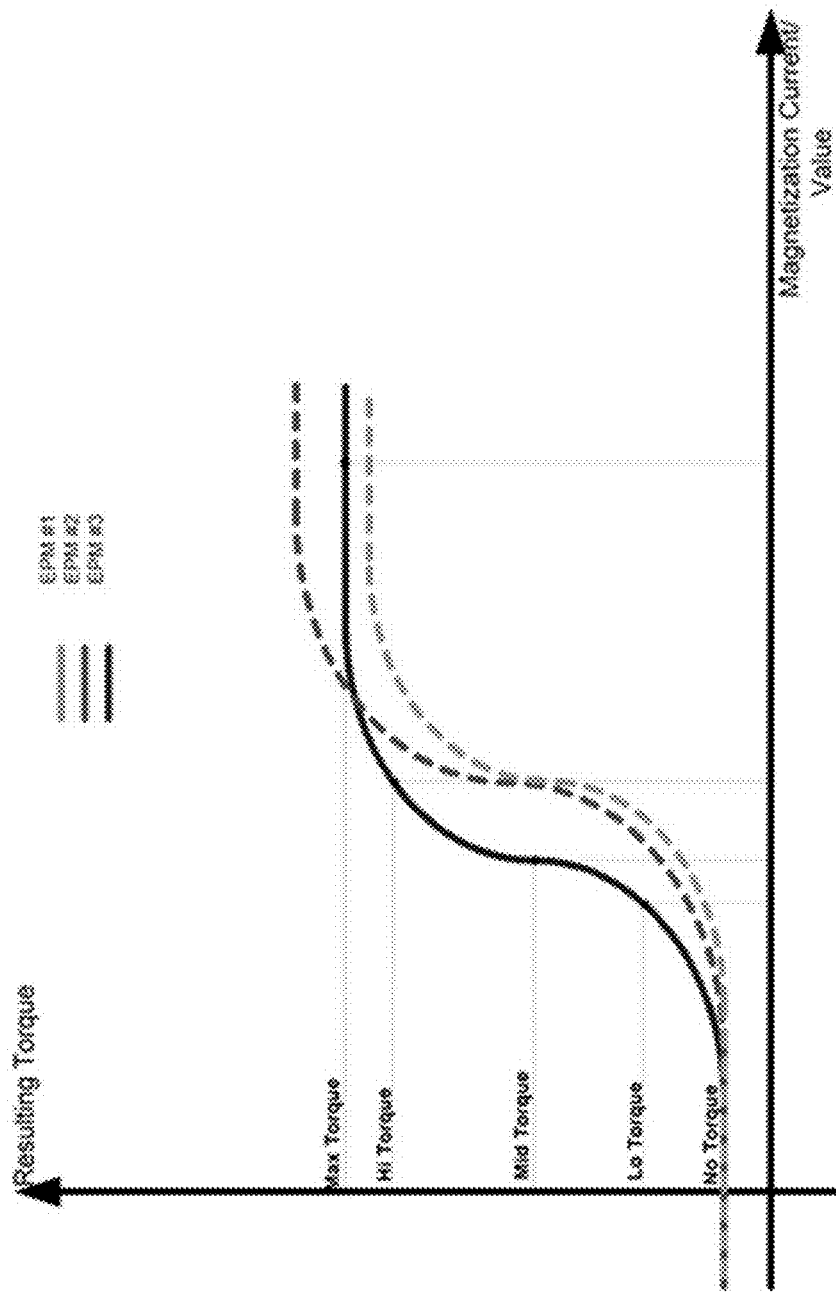
FIG. 18 is a graph illustrating torque vs. the magnetization current value.

As a result, there is nearly exact correspondence between the magnetization current flexing points and the magnetization force curve flexing points (see the graph in FIG. 17). If the absolute torque value of saturated EPM isn't available from the manufacturer (EPM manufacturer can't provide and attribute their test data to each individual EPM), the relative curve is still good enough for the variable relative torque UX.

Also if the saturated EPM torque is unknown (not supplied by the manufacturer), it can be measured (only a single measurement) on the production line test station, reducing the test time down from almost 10 seconds down to 1 second.

Thus, the method above represents the ultra-fast alternative to the standard test method where the magnetization current is gradually increased while the EPM wheel is turning at a constant speed while the EPM torque is measured.

By performing the functional analysis and finding the 2 flex points corresponding for the HIGH (Hi Torque in FIG. 18) and LOW (Lo Torque) torque, the other torque levels can be assigned by dividing the HI-LO curve band by the intervals. Such as in the case of 4 torque levels+1 freewheeling, the band between flex points will have the following level assignments:

Magnetization current=0→freewheeling;
25% of current band between flex points→low torque;
50% of current band between flex points→mid torque;
75% of current band between flex points→high torque; and
Magnetization current=MAX→aturated torque (max ratchet).

This method, without any mechanical calibration, allows having well defined torque bands with a tangible force increase between adjacent levels. However, the absolute force difference between various EPM units (EPM #1, EPM #2, . . . ) will be governed by the manufacturing tolerances, hence the method is for the relative force only. Since it's possible to distinguish the torque differences between adjacent levels, this fulfills the UX team minimum requirement and doesn't require the complex roller force calibration setup.

Figure 19:
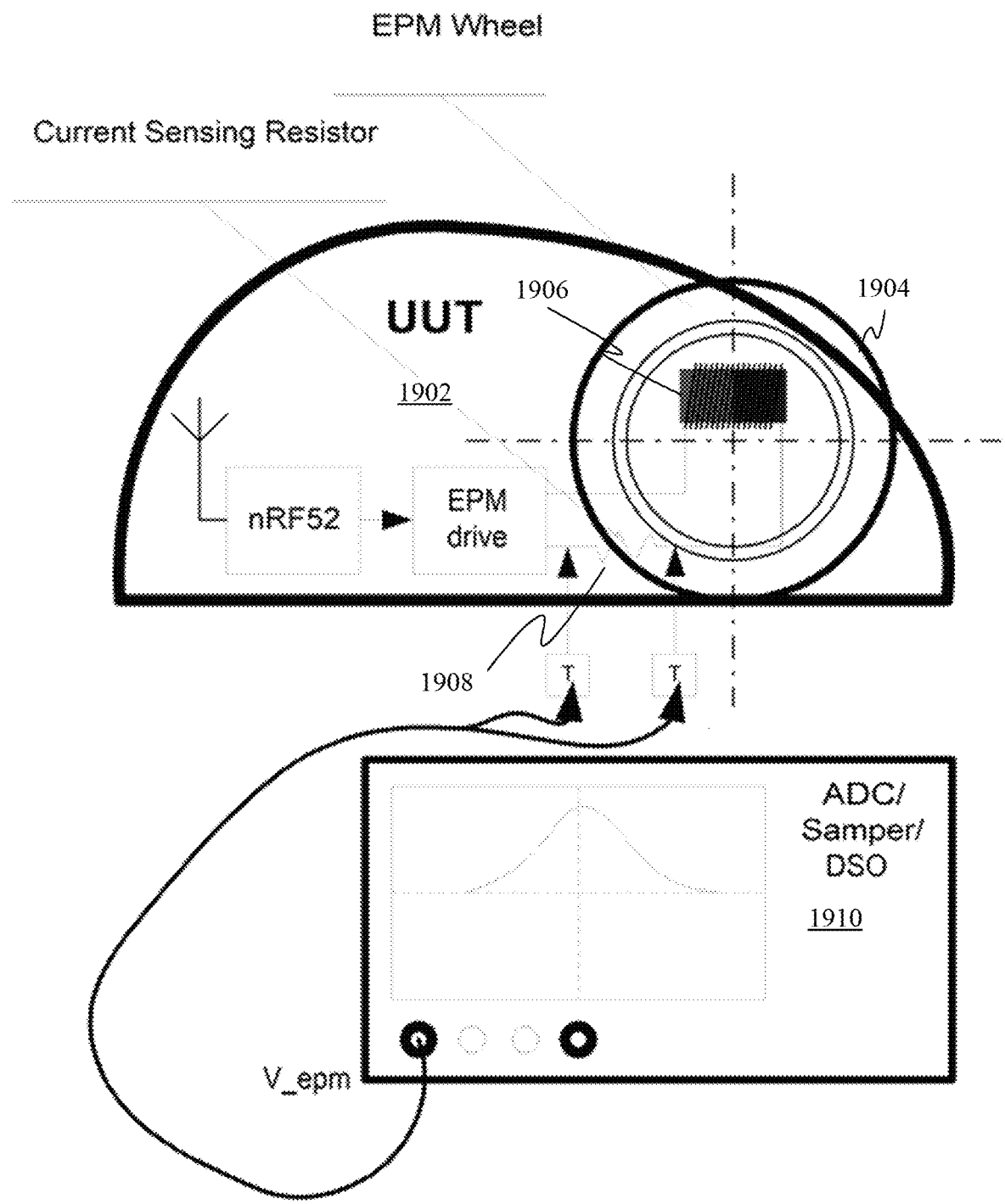
FIG. 19 illustrates a test station setup for capturing the EPM Magnetization Curve, according to embodiments.

The EPM Magnetization Curve can be captured using a test station as illustrated in FIG. 19. An example is shown where the Unit Under Test (UUT) 1902 is a mouse with a scrolling wheel 1904 with an EPM winding 1906. The magnetization curve(s) is obtained by applying the full current to the EPM winding. In one embodiment, two curves are used for both R2F (ratchet to freewheeling) and F2R (freewheeling to ratchet) actions. The test points are placed in the area accessible by the test station pogo pins. Two contacts are used, each labeled "T" (one for GND and another for the current sensing) to transfer the instant voltage measurements across a current sensing resistor 1908 to the sampling hardware, a Digital Storage Oscilloscope (DSO) 1910 with an Analog-to-Digital Converter (ADC) and sampler. In one embodiment, the bandwidth of the equipment is at least 1 MHz.

Figure 20:
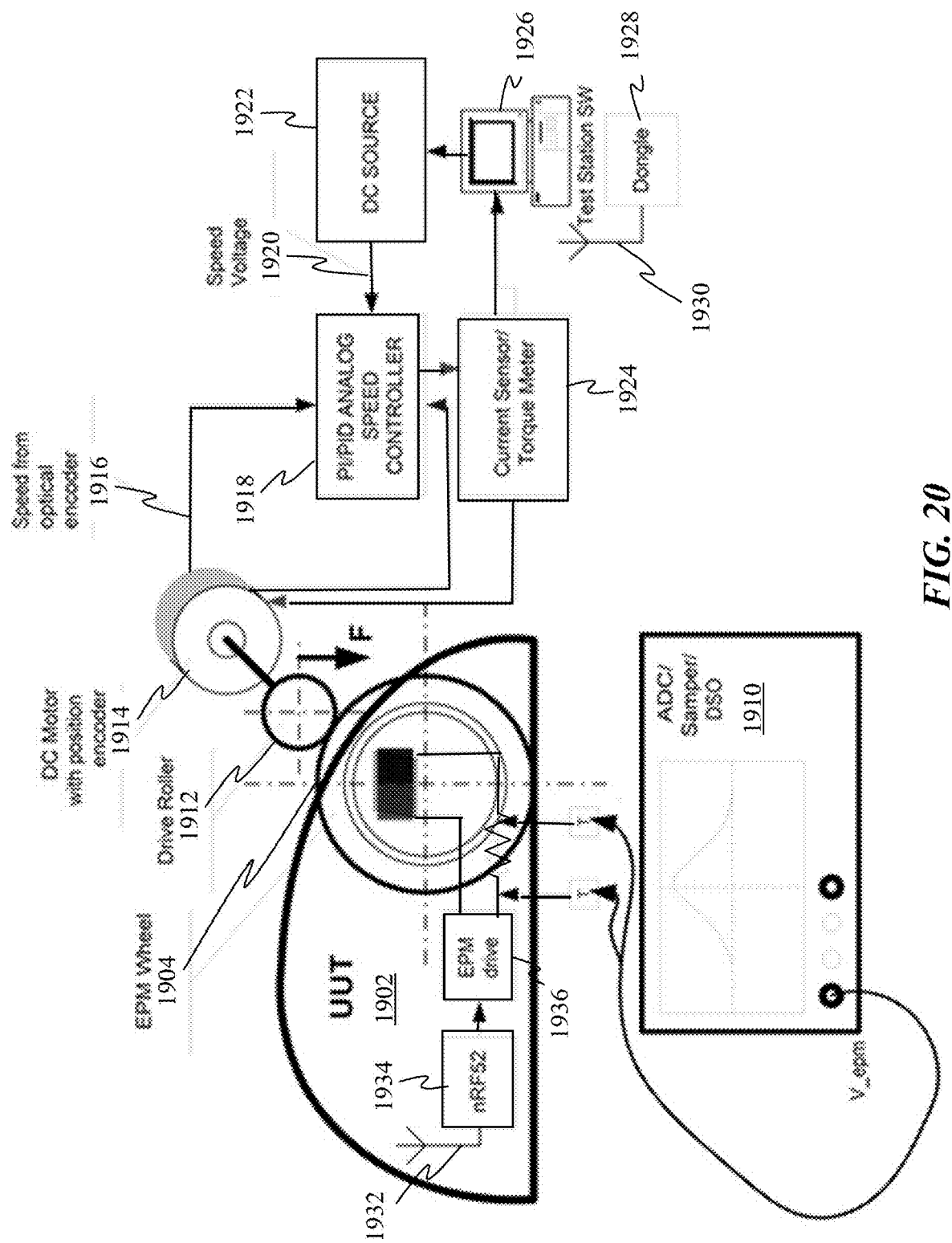
FIG. 20 illustrates a test station calibration setup using an absolute torque calibration method, according to embodiments.

A calibration embodiment using an absolute torque calibration method is illustrated in FIG. 20. This method uses the same flexpoint detection as the relative torque calibration method of FIG. 19. The difference is that after finding the corresponding current levels for 25%, 50%, 75% and 100% torque, these levels are calibrated mechanically by rolling the EPM wheel and measuring the cogging/ratchet friction.

Four levels for Freewheeling→Ratchet and another four levels for Ratchet→Freewheeling can be measured using the test equipment shown in FIG. 20. In total there are 8 torque levels to be measured. Each level measurement is measured using at least 1 full revolution of EPM wheel 1904 on the test station. Assuming that the wheel turns at 300 rpm (5 rotations/sec.), the overall testing will be finished within 2 seconds. Afterwards, the curve fitting (or a simpler polynomial or spline interpolation) is applied and full range of the torque values vs magnetization current is calculated on the test station.

The test set-up of FIG. 20 has a drive roller 1912 biased up against the EPM wheel 1904. The drive roller is driven by a DC motor 1914 with an optical position encoder. The speed from the optical encoder is provided along the output line 1916 to an analog speed controller 1918. Speed controller 1918 receives a speed voltage on a line 1920 from a DC source 1922. DC source 1922 is controlled by a test station 1926, which also receives a signal from current sensor torque meter 1924. The haptic ratchet control signals for EPM wheel 1904 are sent to UUT 1902 via a dongle 1928 and antenna 1930. The wireless signal is received by an antenna 1932 connected to a transceiver 1934, which provides the control signal to an EPM drive circuit 1936.

Embodiments of the present invention can be realized in a variety of apparatuses including electronic devices implemented using any combination of circuitry and software. Furthermore, aspects and/or portions of system 1600 may be combined with or operated by other sub-systems as required by design. For example, input detection module 1650 and/or memory array 1620 may operate within processor(s) 1610 instead of functioning as a separate entity. In addition, the inventive concepts described herein can also be applied to various peripheral devices and not limited to computer mice, keyboards, or microphones. System 1600 can be applied to any of the peripheral devices described in the embodiments herein, whether explicitly, referentially, or tacitly described (e.g., would have been known to be applicable to a particular peripheral device by one of ordinary skill in the art). The foregoing embodiments are not intended to be limiting and those of ordinary skill in the art with the benefit of this disclosure would appreciate the myriad applications and possibilities.

The various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment.

Although the present disclosure provides certain example embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:
1. A circuit comprising:
a multiple-ampere capacitor;
a battery;
a charging circuit connected between the battery and the capacitor;
an actuator;
an electro-permanent magnetic coil configured to drive the actuator;
a switching circuit connected between the multiple-ampere capacitor and the electro-permanent magnetic coil, the switching circuit comprising an H-bridge of four transistors;

a diode configured in parallel with the electro-permanent magnetic coil to provide a current recirculation path when the capacitor is disconnected from the electro-permanent magnetic coil a sensing resistor connected to the electro-permanent magnetic coil;

a comparator having a first input connected to the sensing resistor and a second input connected to a reference voltage; and a digital controller connected to an output of the comparator, wherein the digital controller comprises transistors performing a D flip-flop function, the digital controller being programed to provide a signal on an output of the digital controller connected to the switching circuit to disconnect the capacitor from the electro-permanent magnetic coil when a current from the capacitor to the electro-permanent magnetic coil creates a voltage across the sensing resistor that reaches the reference voltage.

2. The circuit of claim 1 wherein the transistors performing a D flip flop function include at least two transistors configured as a Silicon Controlled Rectifier or a Flip-Flop.

3. The circuit of claim 1 wherein the four transistors of the H-bridge are rated for a constant current many times smaller than the current from the capacitor.

4. The circuit of claim 1 wherein the reference voltage is set below a desired peak charging voltage corresponding to a peak current from the capacitor.

5. The circuit of claim 1 further comprising a haptic actuator coupled to the electro-permanent magnetic coil.

6. A circuit comprising:
a multiple-ampere capacitor;
a battery;
a charging circuit connected between the battery and the capacitor;
an actuator;
an electro-permanent magnet coil configured to drive the actuator;
a switching circuit connected between the multiple-ampere capacitor and the electromagnetic coil;
a sensing resistor connected to the electro-permanent magnet coil;
a comparator having a first input connected to the sensing resistor and a second input connected to a reference voltage; and
a digital controller connected to an output of the comparator, the digital controller being programed to provide a signal on an output of the digital controller connected to the switching circuit to disconnect the capacitor from the electro-permanent magnet coil when a current from the capacitor to the electro-permanent magnet coil creates a voltage across the sensing resistor that reaches the reference voltage.

7. The circuit of claim 6 further comprising:
a diode configured in parallel with the electro-permanent magnet coil to provide a current recirculation path when the capacitor is disconnected from the electro-permanent magnet coil.

8. The circuit of claim 6 wherein the switching circuit comprises an H-bridge of four transistors.

9. The circuit of claim 8 wherein the four transistors of the H-bridge are rated for a constant current many times smaller than the current from the capacitor.

10. The circuit of claim 6 wherein the digital controller comprises transistors performing a D flip-flop function.

11. The circuit of claim 10 wherein the transistors performing a D flip-flop function includes at least two transistors configured as a Silicon Controlled Rectifier or a Flip-Flop.

12. The circuit of claim 6 wherein the reference voltage is set below a desired peak charging voltage corresponding to a peak current from the capacitor.

13. The circuit of claim 6 further comprising a haptic actuator coupled to the electro-permanent magnet coil.

14. The circuit of claim 13 wherein the haptic actuator is a ratchet mechanism for a scrolling wheel.

15. A method of charging an electro-permanent magnet actuator comprising:
charging a multiple-ampere capacitor with a battery;
switching the capacitor from being connected to the battery for charging to being connected to the electro-permanent magnet actuator for providing a current pulse to activate the electro-permanent magnet actuator;
detecting an amount of current applied to the electro-permanent magnet actuator;
disconnecting the capacitor from the electro-permanent magnet actuator when the amount of current is detected to be at a threshold level below a desired current peak;
recharging the multiple-ampere capacitor with the battery.

16. The method of claim 15 wherein a difference between the threshold level and the desired current peak corresponds to the amount of current provided by the capacitor during a delay time between detecting the current pulse at a threshold level and activating circuitry to switch the capacitor to be disconnected from the electro-permanent magnet actuator.

17. The method of claim 15 wherein the threshold level and desired current peak are in a linear region of a charging curve of the current pulse.

18. The method of claim 15 wherein switching the capacitor is done with four transistors in an H-bridge, wherein the four transistors are rated for a current several times smaller than the desired peak, to minimize their size and thus minimize their gate capacitance and switching time.

19. The method of claim 18 wherein disconnecting the capacitor from the electro-permanent magnet actuator is performed by providing a control signal to the H-bridge using a D flip-flop function with transistors operating as a Silicon Controlled Rectifier or a Flip-Flop.

20. The method of claim 15 further comprising switching the capacitor to connect to the electro-permanent magnet actuator in response to a ratchet signal for a scrolling wheel in a computer peripheral.

\* \* \* \* \*